(12) United States Patent
Mikawa et al.

(10) Patent No.: US 8,426,836 B2
(45) Date of Patent: Apr. 23, 2013

(54) NONVOLATILE MEMORY DEVICE AND MANUFACTURING METHOD THEREOF

(75) Inventors: Takumi Mikawa, Shiga (JP); Yoshio Kawashima, Osaka (JP); Atsushi Himeno, Osaka (JP)

(73) Assignee: Panasonic Corporation, Osaka (JP)

( * ) Notice: Subject to any disclaimer, the term of this patent is extended or adjusted under 35 U.S.C. 154(b) by 106 days.

(21) Appl. No.: 13/132,544

(22) PCT Filed: Jun. 30, 2009

(86) PCT No.: PCT/JP2009/003004
§ 371 (c)(1),
(2), (4) Date: Aug. 4, 2011

(87) PCT Pub. No.: WO2010/064340
PCT Pub. Date: Jun. 10, 2010

(65) Prior Publication Data
US 2012/0097915 A1    Apr. 26, 2012

(30) Foreign Application Priority Data
Dec. 3, 2008 (JP) ................................. 2008-308162

(51) Int. Cl.
*H01L 29/02* (2006.01)
(52) U.S. Cl.
USPC ..... 257/2; 257/3; 257/4; 257/5; 257/E29.002; 438/102; 438/103; 438/104
(58) Field of Classification Search ............... 257/2–5, 257/E29.002; 438/102–104
See application file for complete search history.

(56) References Cited

U.S. PATENT DOCUMENTS

| | | |
|---|---|---|
| 2005/0247921 A1 | 11/2005 | Lee et al. |
| 2007/0015328 A1 | 1/2007 | Hsu et al. |
| 2007/0015329 A1 | 1/2007 | Li et al. |
| 2007/0015330 A1 | 1/2007 | Li et al. |
| 2007/0015348 A1 | 1/2007 | Hsu et al. |
| 2007/0284575 A1 | 12/2007 | Li et al. |
| 2008/0006814 A1 | 1/2008 | Hsu et al. |
| 2008/0006907 A1 | 1/2008 | Lee et al. |
| 2009/0032817 A1 | 2/2009 | Li et al. |
| 2009/0052225 A1 | 2/2009 | Morimoto |
| 2009/0096568 A1 | 4/2009 | Hosoi et al. |
| 2009/0200640 A1 | 8/2009 | Hosoi et al. |
| 2009/0224224 A1 | 9/2009 | Fujii et al. |
| 2010/0032641 A1 | 2/2010 | Mikawa et al. |

FOREIGN PATENT DOCUMENTS

| | | |
|---|---|---|
| JP | 2008-159760 | 7/2008 |
| WO | WO 2006/075574 A1 | 7/2006 |

*Primary Examiner* — Jami M Valentine
(74) *Attorney, Agent, or Firm* — McDermott Will & Emery LLP

(57) ABSTRACT

There are provided a resistance variable nonvolatile memory device which changes its resistance stably at low voltages and is suitable for a miniaturized configuration, and a manufacturing method thereof. The nonvolatile memory device comprises: a substrate (100); a first electrode (101); an interlayer insulating layer (102); a memory cell hole (103) formed in the interlayer insulating layer; a first resistance variable layer (104a) formed in at least a bottom portion of the memory cell hole and connected to the first electrode; a second resistance variable layer (104b) formed inside the memory cell hole (103) and located on the first resistance variable layer (104a); and a second electrode (105); the first resistance variable layer (104a) and the second resistance variable layer (104b) respectively comprising metal oxides of the same kind; and the first resistance variable layer (104a) having a higher oxygen content than the second resistance variable layer (104b).

21 Claims, 14 Drawing Sheets

NUMBER OF TIMES OF PULSE APPLICATIONS

NONVOLATILE MEMORY DEVICE AND MANUFACTURING METHOD THEREOF

RELATED APPLICATIONS

This application is the U.S. National Phase under 35 U.S.C. §371 of International Application No. PCT/JP2009/003004, filed on Jun. 30, 2009, which in turn claims the benefit of Japanese Application No. 2008-308162, filed on Dec. 3, 2008, the disclosures of which Applications are incorporated by reference herein.

TECHNICAL FIELD

The present invention relates to a resistance variable nonvolatile memory device including a resistance variable element which stably changes its resistance values retained, by application of voltage pulses.

BACKGROUND ART

With recent advancement of digital technologies, electronic equipment such as portable information devices and information home appliances has been developed to provide higher functionality. As the electronic equipment has been developed to provide higher functionality, development of miniaturized and higher-speed semiconductor elements incorporated into the electronic equipment is progressing at a high pace. Among them, the use of a large-capacity nonvolatile memory which is represented by a flash memory has been spreading at a rapid pace. Furthermore, as a next-generation new nonvolatile memory which has a potential to replace the flash memory, a resistance variable nonvolatile memory device including a so-called resistance variable element has been researched and developed. The resistance variable element is defined as an element which has a characteristic in which its resistance values change reversibly in response to electric signals and is able to store information corresponding to the resistance values in a nonvolatile manner.

As an example of a large-capacity nonvolatile memory element incorporating the resistance variable element, a cross-point nonvolatile memory has been proposed. An element is disclosed, which is configured to include a resistance variable layer as a memory section and a diode element as a switching element (see, for example, Patent Literature 1).

FIGS. 14A and 14B show a nonvolatile memory device 50 including a conventional resistance variable element. FIG. 14A is a perspective view of a cross-point memory cell array including bit lines and word lines and memory cells provided at cross-points of the bit lines and the word lines, respectively, while FIG. 14B is a cross-sectional view of a memory cell 280, a bit line 210 and a word line 220 which are taken along a bit line direction. A resistance variable element 260 has a structure in which a resistance variable layer 230 adapted to change its electric resistance by electric stresses to thereby store data is sandwiched between an upper electrode 240 and a lower electrode 250. A two-terminal non-linear element 270 having a non-linear current-voltage characteristic in which the non-linear element 270 is capable of flowing a current bidirectionally, is provided at the upper side of the resistance variable element 260. The memory cell 280 is constituted by a series circuit including the resistance variable element 260 and the non-linear element 270. The non-linear element 270 is a two-terminal element having a non-linear current-voltage characteristic in which a current changes at an inconstant rate with respect to a voltage change, like a diode or the like. The bit line 210 which serves as an upper wire is electrically connected to the non-linear element 270. The word line 220 which serves as a lower wire is electrically connected to the lower electrode 250 of the resistance variable element 260. As the non-linear element 270, for example, a varistor (ZnO, $SrTiO_3$, etc.) having a current-voltage characteristic which is symmetric bidirectionally and is non-linear, is used, because it flows a current bidirectionally when data is rewritten in the memory cell 280. It is recited that with the above configuration, it becomes possible to flow a current with a current density required to rewrite data in the resistance variable element 260, which is not less than $30\, kA/cm^2$, thereby attaining a larger capacity.

CITATION LIST

Patent Literature

Patent Literature 1: Japanese Laid-Open Patent Application Publication No. 2006-203098

SUMMARY OF THE INVENTION

Technical Problem

However, the memory cell 280 in the above mentioned conventional structure, is formed only at a cross-point of the bit line 210 and the word line 220 by so-called double patterning in which the upper electrode 240, the resistance variable layer 230, the lower electrode 250 and the non-linear element 270 are patterned together along the direction in which the bit line 210 extends, in processing of the bit line 210, and are patterned together along the direction in which the word line 220 extends, in processing of the word line 220. In this manufacturing method, it is difficult to perform patterning by etching, and the structure formed by this method is not suitable for a miniaturized configuration, because layers to be patterned increases in thickness and a plurality of element layers comprising materials different from each other are formed together.

The present invention is directed to solving the above mentioned problem, and an object of the present invention is to provide a structure in which a resistance variable element is filled into a hole structure suitable for a miniaturized configuration. In particular, by using a structure in which a first resistance variable layer with a higher oxygen content is disposed at the bottom portion of a memory cell hole such that the first resistance variable layer is connected to a first electrode, and a second resistance variable layer with a lower oxygen content is disposed at the upper side of the first resistance variable layer, resistance change is allowed to occur surely in a region of an interface with the first electrode, thereby attaining a stable memory characteristic. In addition, by using the second electrode of the resistance variable element as the electrode of a diode element operative as a switching element, the diode element can be filled into the upper portion of the memory cell hole, in addition to the resistance variable element disposed at the bottom portion of the memory cell hole. In accordance with the manufacturing method of the present invention, a patterning step using dry etching is not performed after the resistance variable layer is deposited. Therefore, the resistance variable layer can be formed without performing an etching which might cause a reaction with an etching gas, damages due to redox, and damages due to charging, in principle. In other words, an object of the present invention is to provide a resistance variable nonvolatile memory device in which resistance change occurs stably at low voltages and which is suitable for a miniaturized configuration, and a manufacturing method thereof.

Solution to Problem

To achieve the above objective, a first resistance variable nonvolatile memory device of the present invention, comprises a substrate; a first electrode formed on the substrate; an interlayer insulating layer formed over the substrate and the first electrode; a memory cell hole formed in the interlayer insulating layer on the first electrode; a first resistance variable layer formed in at least a bottom portion of the memory cell hole and connected to the first electrode; a second resistance variable layer formed inside the memory cell hole and located on the first resistance variable layer; and a second electrode formed on the interlayer insulating layer to cover the second resistance variable layer; the first resistance variable layer and the second resistance variable layer respectively comprising metal oxides of the same kind; and the first resistance variable layer having a higher oxygen content than the second resistance variable layer.

In accordance with such a configuration, since the resistance variable element can be filled into the hole structure suitable for a miniaturized configuration, it is possible to implement a resistance variable nonvolatile memory device suitable for a larger capacity and higher-dense integration. In addition, since the first resistance variable layer with a higher oxygen content is disposed at the bottom portion of the memory cell hole such that the first resistance variable layer is connected to the first electrode, and the second resistance variable layer with a lower oxygen content is disposed at the upper side of the first resistance variable layer, resistance change is allowed to occur surely in the region of the interface with the first electrode, and the polarity with which resistance change occurs is always stabilized. As a result, a stable memory characteristic is attained. This is because in the mechanism of a resistance changing operation, redox of oxygen in the region in the vicinity of the interface with the electrode is dominant, and the resistance changing operation occurs preferentially in the region of the interface where oxygen which can make contribution to the redox is large in quantity.

A second resistance variable nonvolatile memory device of the present invention comprises: a substrate; a first electrode formed on the substrate; an interlayer insulating layer formed over the substrate and the first electrode; a memory cell hole formed in the interlayer insulating layer on the first electrode; a first resistance variable layer formed in at least a bottom portion of the memory cell hole and connected to the first electrode; a second resistance variable layer formed inside the memory cell hole and located on the first resistance variable layer; a second electrode formed inside the memory cell hole and located on the second resistance variable layer; and a third electrode formed on the interlayer insulating layer to cover the second electrode; the first resistance variable layer and the second resistance variable layer respectively comprising metal oxides of the same kind; and the first resistance variable layer having a higher oxygen content than the second resistance variable layer.

In accordance with such a configuration, since the resistance variable element can be filled into the hole structure suitable for a miniaturized configuration, it is possible to implement a resistance variable nonvolatile memory device suitable for a larger capacity and higher-dense integration. In addition, since the first resistance variable layer with a higher oxygen content is disposed at the bottom portion of the memory cell hole such that the first resistance variable layer is connected to the first electrode, and the second resistance variable layer with a lower oxygen content is disposed at the upper side of the first resistance variable layer, resistance change is allowed to occur surely in the region of the interface with the first electrode, and the polarity with which resistance change occurs is always stabilized. As a result, a stable memory characteristic is attained. Since the second electrode is filled into the memory cell hole, the layer of the second resistance variable layer can be reduced, and the electric field in the first and second resistance variable layers can be intensified. Therefore, the resistance variable nonvolatile memory device is operative at low voltages. A material for the second electrode and a material for the third electrode are selectable according to the use, for example, an electrically-conductive material which is easily filled into the memory cell hole is used as the second electrode, while an electrically-conductive material with a low resistivity is used as the third electrode, in order to suppress an increase in a wire resistance.

A third resistance variable nonvolatile memory device of the present invention comprises a substrate; a first electrode formed on the substrate; an interlayer insulating layer formed over the substrate and the first electrode; a memory cell hole formed in the interlayer insulating layer on the first electrode; a first resistance variable layer formed in at least a bottom portion of the memory cell hole and connected to the first electrode; a second resistance variable layer formed inside the memory cell hole and located on the first resistance variable layer; a second electrode formed inside the memory cell hole and located on the second resistance variable layer; a semiconductor layer or an insulator layer which is formed over the interlayer insulating layer to cover the second electrode; and a third electrode formed to cover at least the semiconductor layer or the insulator layer over the second electrode; the first resistance variable layer and the second resistance variable layer respectively comprising metal oxides of the same kind; and the first resistance variable layer having a higher oxygen content than the second resistance variable layer.

In accordance with such a configuration, the resistance variable element is filled into the bottom portion of the memory cell hole, and the bidirectional diode having a structure in which the semiconductor layer or the insulator layer is sandwiched between the second electrode and the third electrode can be formed at the upper portion of the memory cell hole. Therefore, it is possible to implement a resistance variable nonvolatile memory device which enables achievement of a larger capacity and a higher-dense integration, without providing the switching element such as a transistor. In addition, since the first resistance variable layer with a higher oxygen content is disposed at the bottom portion of the memory cell hole such that the first resistance variable layer is connected to the first electrode, and the second resistance variable layer with a lower oxygen content is disposed at the upper side of the first resistance variable layer, resistance change is allowed to occur surely in the region of the interface with the first electrode, and the polarity with which resistance change occurs is always stabilized. As a result, a stable memory characteristic is attained. Furthermore, in the above diode element configuration, an area of a portion of the third electrode and a portion of the semiconductor layer or the insulator layer which are in contact with each other is larger than an area of a portion of the second electrode and a portion of the semiconductor layer or the insulator layer which are in contact with each other. Therefore, a line of electric force spreads to a location in the vicinity of the second electrode, and a current drivability can be increased. In the manner as described above, a current necessary and sufficient to allow resistance change to occur stably, can be ensured.

In the resistance variable layer configuration of the first, second and third resistance variable nonvolatile memory devices, the first resistance variable layer may be formed in at least a portion of a side wall of the memory cell hole, in addition to the bottom portion of the memory cell hole.

In accordance with such a configuration, a cell current does not substantially flow through the first resistance variable layer which is formed on the side wall of the memory cell, is higher in oxygen content and has a higher resistance, but instead, the cell current flows intensively through the second resistance variable layer with a relatively low resistance which is formed inwardly of the first resistance variable layer. This allows resistance change to occur more stably at a bottom region in the vicinity of the center of the memory cell hole. Since the cell does not flow through the first resistance variable layer formed on the side wall of the memory cell hole, the cell current and electric power consumption can be reduced effectively. Since the first resistance variable layer is disposed on the side wall as well as the bottom portion of the memory cell hole, the resistance variable layer can be deposited by sputtering, CVD, etc., which results in an advantage in the manufacturing method.

Each of the first resistance variable layer and the second resistance variable layer may comprise an oxygen-deficient transition metal oxide. To be specific, each of the first resistance variable layer and the second resistance variable layer may comprise a transition metal oxide of tantalum or hafnium. In accordance with such a configuration, the resistance variable layer has a reversible and stable rewrite characteristic and a good resistance value retention characteristic, in addition to high-speed operability. In particular, tantalum oxide can be manufactured in manufacturing process steps which is highly compatible with normal Si semiconductor process steps.

In the electrode configuration of the first, second and third resistance variable nonvolatile memory devices, it is preferable that the first electrode and the second electrode may be respectively formed of materials comprising elements different from each other, and a standard electrode potential V1 of the first electrode, a standard electrode potential V2 of the second electrode and a standard electrode potential Vt of metal constituting the first and second resistance variable layers satisfy Vt<V1 and V2<V1. In accordance with such a configuration, the resistance change can occur always in a specified region of the resistance variable layer which is the region of the interface with the first electrode having a higher standard electrode potential V1, and an incorrect operation in the region of the interface with the second electrode having a standard electrode potential V2 lower than the standard electrode potential V1 can be suppressed. Since the polarity with which resistance change occurs is always stabilized, it is possible to implement a resistance variable nonvolatile memory device which performs a resistance changing operation more stably.

The first electrode may comprise one of Pt, Ir, Pd, and Cu, or a combination and alloy of Pt, Ir, Pd, and Cu, and the second electrode may comprise one of TaN, TiN, and W.

Pt (1.188 eV; a standard electrode potential, the same occurs hereinafter, unit: electron volt), Ir (1.156 eV), Pd (0.951 eV), Cu (0.521 eV), etc., are higher in standard electrode potential than Ta (−0.6 eV) and Hf (−1.55 eV), and are desirable candidates of the first electrode which allows resistance change to occur in a region of the corresponding interface. In particular, Pt, Cu, etc., are used in a manufacturing method using a damascene process by plating and CMP, and have high practicability. In contrast, TaN (0.48 eV), TiN (0.55 eV), and W (−0.12 eV) are desirable candidates of the second electrode, because their standard electrode potentials are comparatively lower, depending on a combination with the first electrode. Further, these electrodes are desirable as the second electrode because their characteristics are confirmed as the electrodes of the MSM diode or the MIM diode.

In the semiconductor layer configuration of the MSM diode element of the third resistance variable nonvolatile memory device, it is preferable that the semiconductor layer may comprise nitrogen-deficient silicon nitride. By setting the amount of deficiency of nitrogen smaller, the MSM diode element can flow a higher current bidirectionally. Therefore, such a MSM diode element is suitable as the switching element.

The third resistance variable nonvolatile memory device may comprise a plurality of first electrodes formed in a stripe shape to extend in parallel with each other; and a plurality of third electrodes formed in a stripe shape to extend in parallel with each other; each of the first electrodes may cross a corresponding one of the third electrodes on the memory cell hole.

In accordance with such a configuration, it is possible to provide a cross-point memory nonvolatile memory device which can stabilize its resistance changing operation, reduce a leak current, and achieve a larger capacity and higher-dense integration.

A first method of manufacturing the resistance variable nonvolatile memory device of the present invention, comprises a step of forming a first electrode on a substrate; a step of forming an interlayer insulating layer over the substrate and the first electrode; a step of forming a memory cell hole in the interlayer insulating layer in a predetermined location on the first electrode; a step of forming a first resistance variable layer into at least a bottom portion of the memory cell hole such that the first resistance variable layer is connected to the first electrode; a step of forming a second resistance variable layer on the first resistance variable layer inside the memory cell hole; and a step of forming a second electrode on the interlayer insulating layer such that the second electrode covers the second resistance variable layer; the first resistance variable layer and the second resistance variable layer respectively comprising metal oxides of the same kind; and the first resistance variable layer having a higher oxygen content than the second resistance variable layer.

In accordance with such a manufacturing method, since the resistance variable element can be filled into the hole structure suitable for a miniaturized configuration, it is possible to manufacture a resistance variable nonvolatile memory device suitable for a larger capacity and higher-dense integration. In addition, since the first resistance variable layer with a higher oxygen content is disposed at the bottom portion of the memory cell hole such that the first resistance variable layer is connected to the first electrode, and the second resistance variable layer with a lower oxygen content is disposed at the upper side of the first resistance variable layer, resistance change is allowed to occur surely in a region of the interface with the first electrode, and the polarity with which resistance change occurs is always stabilized. As a result, a stable memory characteristic is attained.

A second method of manufacturing the resistance variable nonvolatile memory device of the present invention, comprises a step of forming a first electrode on a substrate; a step of forming an interlayer insulating layer over the substrate and the first electrode; a step of forming a memory cell hole in the interlayer insulating layer in a predetermined location on the first electrode; a step of forming a first resistance variable layer into at least a bottom portion of the memory cell hole such that the first resistance variable layer is connected to the first electrode; a step of forming a second resistance variable layer on the first resistance variable layer inside the memory cell hole; a step of forming a second electrode on the second resistance variable layer inside the memory cell hole; and a step of forming a third electrode on the interlayer insulating layer such that the third electrode covers the second electrode; the first resistance variable layer and the second resistance variable layer respectively comprising metal oxides of the same kind; and the first resistance variable layer having a higher oxygen content than the second resistance variable layer.

In accordance with such a manufacturing method, since the resistance variable element can be filled into the hole structure suitable for a miniaturized configuration, it is possible to manufacture a resistance variable nonvolatile memory device suitable for a larger capacity and higher-dense integration. In addition, since the resistance change is allowed to occur surely in the region of the interface with the first electrode, and the polarity with which resistance change occurs is always stabilized, a stable memory characteristic is attained. Since the second electrode is filled into the memory cell hole, the thickness of the second resistance variable layer can be reduced, and the electric field in the first and second resistance variable layers can be intensified. Therefore, the resistance variable nonvolatile memory device is operative at low voltages. A material for the second electrode and a material for the third electrode are selectable according to the use, for example, an electrically-conductive material which is easily filled into the memory cell hole is used as the second electrode, while an electrically-conductive material with a low resistivity is used as the third electrode, in order to suppress an increase in a wire resistance.

A third method of manufacturing a resistance variable nonvolatile memory device of the present invention, comprises a step of forming a first electrode on a substrate; a step of forming an interlayer insulating layer over the substrate and the first electrode; a step of forming a memory cell hole in the interlayer insulating layer in a predetermined location on the first electrode; a step of forming a first resistance variable layer into at least a bottom portion of the memory cell hole such that the first resistance variable layer is connected to the first electrode; a step of forming a second resistance variable layer on the first resistance variable layer inside the memory cell hole; a step of forming a second electrode on the second resistance variable layer inside the memory cell hole; a step of forming a semiconductor layer or an insulator layer over the interlayer insulating layer such that the semiconductor layer or the insulator layer covers the second electrode; and a step of forming a third electrode such that the third electrode covers at least the semiconductor layer or the insulator layer on the second electrode; the first resistance variable layer and the second resistance variable layer respectively comprising metal oxides of the same kind; and the first resistance variable layer having a higher oxygen content than the second resistance variable layer.

In accordance with such a manufacturing method, the resistance variable element is filled into the bottom portion of the memory cell hole, and the bidirectional diode having a structure in which the semiconductor layer is sandwiched between the second electrode and the third electrode can be formed at the upper portion of the memory cell hole. Therefore, it is possible to implement a resistance variable nonvolatile memory device which enables achievement of a larger capacity and a higher-dense integration, without providing the switching element such as a transistor. In addition, since resistance change is allowed to occur surely in a region of the interface with the first electrode, and the polarity with which resistance change occurs is always stabilized, a stable memory characteristic is attained. Furthermore, in the above diode element configuration, an area of a portion of the third electrode and a portion of the semiconductor layer or the insulator layer which are in contact with each other is larger than an area of a portion of the second electrode and a portion of the semiconductor layer or the insulator layer which are in contact with each other. Therefore, a line of electric force spreads to a location in the vicinity of the second electrode, and a current drivability can be increased. In the manner as described above, a current necessary and sufficient to allow resistance change to occur stably, can be ensured.

In the first, second and third methods of manufacturing the resistance variable nonvolatile memory device, the first resistance variable layer is formed in at least a portion of a side wall of the memory cell hole, in addition to the bottom portion of the memory cell hole.

In accordance with such a manufacturing method, since the resistance variable layer can be deposited by sputtering, CVD, etc., providing high practicability, it is possible to lessen a variation in thickness of the resistance variable layer, which results in the manufacturing method.

The above object, other objects, features, and advantages of the present invention will be apparent by the following detailed description of preferred embodiments of the inventions, with reference to the accompanying drawings.

Advantageous Effect of the Invention

In the resistance variable nonvolatile memory device of the present invention, since the resistance variable element can be filled into the hole structure suitable for a miniaturized configuration, the first resistance variable layer with a higher oxygen content is disposed at the bottom portion of the memory cell hole such that the first resistance variable layer is connected to the first electrode, and the second resistance variable layer with a lower oxygen content is disposed at the upper side of the first resistance variable layer, it is possible to achieve advantages that the resistance change is allowed to occur surely in a region of the interface with the first electrode, and a stable memory characteristic is attained. In addition, since the diode element is formed at the upper portion of the memory cell hole, using the second electrode of the resistance variable element as the electrode of the diode element which serves as a switching element, it is possible to implement a resistance variable nonvolatile memory device suitable for a larger capacity and higher-dense integration.

DESCRIPTION OF EMBODIMENTS

Figure 1:
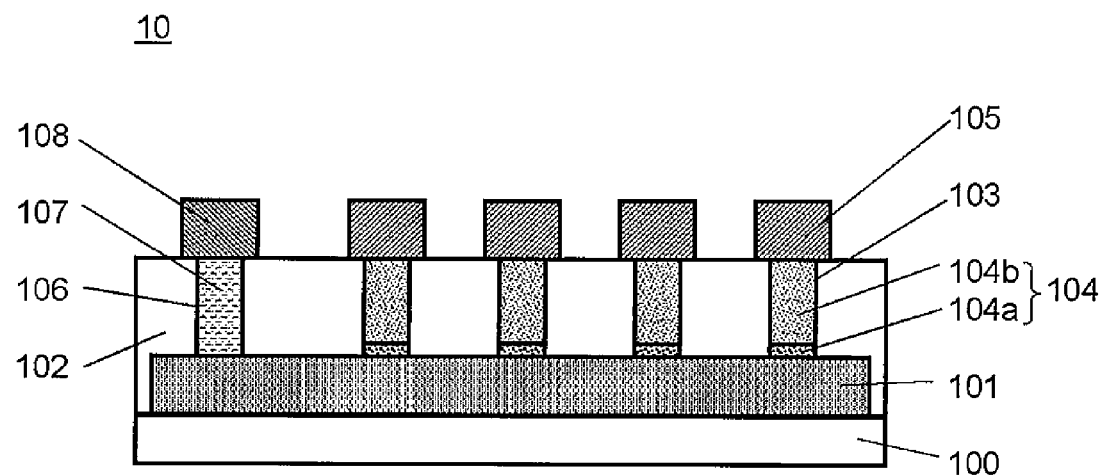
FIG. 1 is a cross-sectional view showing an exemplary configuration of a resistance variable nonvolatile memory device according to Embodiment 1 of the present invention.

Hereinafter, nonvolatile memory devices and manufacturing methods thereof according to embodiments of the present invention will be described with reference to the drawings. Throughout the drawings, the same or corresponding constituents are designated by the same reference numerals and will not be described repetitively in some cases. It should be noted that the respective constituents are schematically depicted and their shapes and dimension, etc., are not precise in the drawings.

Embodiment 1

FIG. 1 is a cross-sectional view showing an exemplary configuration of a resistance variable nonvolatile memory device 10 according to Embodiment 1 of the present invention. As shown in FIG. 1, the resistance variable nonvolatile memory device 10 of this embodiment includes a substrate 100 provided with a first electrode 101, an interlayer insulating layer 102 provided over the substrate 100 to cover the first electrode 101 and formed of a silicon oxide layer (150~500 nm in thickness), a memory cell hole 103 (50~300 nm dia.) penetrating the interlayer insulating layer 102, and a contact hole 106 (50~300 nm dia.) penetrating the interlayer insulating layer 102. A first resistance variable layer 104a (1~10 nm in thickness) is formed at the bottom portion of the memory cell hole 103 such that the first resistance variable layer 104a is in contact with the first electrode 101 and a second resistance variable layer 104b (150~500 nm in thickness) is formed at the upper side of the first resistance variable layer 104a. The memory cell hole 103 is filled with the first resistance variable layer 104a and the second resistance variable layer 104b. An electrically-conductive plug 107 comprising tungsten as a major component is filled into the contact hole 106. The first electrode 101, the electrically-conductive plug 107 and a lead-out wire 108 are electrically connected to each other. On the interlayer insulating layer 102, a second electrode 105 is formed to cover the second resistance variable layer 104b formed inside the memory cell hole 103. The lead-out wire 108 is connected to the electrically-conductive plug 107 formed inside the contact hole 106. The resistance variable element is configured to include the first electrode 101, the first resistance variable layer 104a, the second resistance variable layer 104b and the second electrode 105.

The resistance variable layer 104 of the resistance variable element comprises a transition metal oxide made of an oxygen-deficient tantalum oxide or a transition metal oxide made of an oxygen-deficient hafnium oxide. The oxygen-deficient transition metal oxide is defined as an oxide which is less in content x of oxygen O than a stoichiometrically stable state, when the transition metal oxide is expressed as $MO_x$ in which M is transition metal and O is oxygen. By using the resistance variable layer comprising the transition metal oxide made of the oxygen-deficient tantalum oxide or the transition metal oxide made of the oxygen-deficient hafnium oxide, a nonvolatile memory element having a reversible and stable rewrite characteristic and utilizing a resistance changing phenomenon is attainable. These features are explained in detail in the related Patent Applications which are International Application Publication No. 2008/059701 and Japanese Patent Application No. 2007-267584. A configuration in which an oxygen-deficient tantalum oxide includes a higher-concentration-oxygen-containing layer and a lower-concentration-oxygen-containing layer are stacked together, and a configuration in which an oxygen-deficient hafnium oxide includes a higher-concentration-oxygen-containing layer and a lower-concentration-oxygen-containing layer are stacked together are explained in detail in Japanese Patent Application Nos. 2008-535819 and 2008-180946. In this embodiment, the oxygen content of the first resistance variable layer (higher-concentration-oxygen-containing layer) 104a is set to 65~80 atm %, while the oxygen content of the second resistance variable layer (lower-concentration-oxygen-containing layer) 104b is set to 50~65 atm %. This is because, by setting the oxygen content of a region of the resistance variable layer 104 in the vicinity of the first electrode 101 higher, resistance change resulting from redox in a region of the interface with the first electrode is allowed to occur easily. Thus, a favorable memory cell characteristic in which the memory is drivable at low voltages is attained.

Platinum is used as the first electrode 101 which becomes the lower electrode of the resistance variable element and tantalum nitride is used as the second electrode 105 which becomes the upper electrode of the resistance variable element. A standard electrode potential V1 of platinum is 1.188 eV. A standard electrode potential V2 of tantalum nitride is 0.48 eV. In general, a standard electrode potential is an index indicating to what degree oxidization occurs easily. As the value of the standard electrode potential is larger, oxidization occurs less easily, whereas as the value of the standard electrode potential is smaller, oxidization occurs more easily. As a difference between the standard electrode potential of the electrode and the standard electrode potential of the resistance variable layer is larger, resistance change occurs more easily, whereas as the difference is smaller, resistance change occurs less easily. From this, it is presumed that easiness of oxidization performs an important role in the mechanism of a resistance changing phenomenon. A standard electrode potential Vt indicating the degree to which redox of tantalum occurs easily is −0.6 eV and a standard electrode potential Vt indicating the degree to which redox of hafnium occurs easily is −1.55 eV. A relationship of Vt<V1 is satisfied, irrespective of whether tantalum or hafnium is used as the resistance variable layer. Therefore, redox occurs in the region of the interface between the first electrode 101 comprising platinum and the first resistance variable layer 104a, and oxygen migrates to get together in this region and migrates away therefrom. As a result, a resistance changing phenomenon occurs. In addition, since a relationship of V1>V2 is satisfied, the redox occurs preferentially in the region of the interface between the first electrode 101 comprising platinum and the first resistance variable layer 104a, rather than in the region of the interface between the second electrode 105 comprising tantalum nitride and the second resistance variable layer 104b. This means that the resistance changing phenomenon can occur always in a region of a specified one of the interfaces and an incorrect operation associated with the resistance changing phenomenon at the other electrode side can be prevented. Since the first electrode is required to have a function (its resistivity is low) as a wire, it may have a structure in which copper as a lower layer and platinum as an upper layer are stacked together. Alternatively, a portion of the first electrode 101 may be formed at the bottom portion of the memory cell hole 103, inside the memory cell hole 103.

FIGS. 2A to 2D and FIGS. 3A to 3C are cross-sectional views showing a manufacturing method of major constituents of the resistance variable nonvolatile memory device 10 according to Embodiment 1. The manufacturing method will be described with reference to these Figures.

Figure 2A:
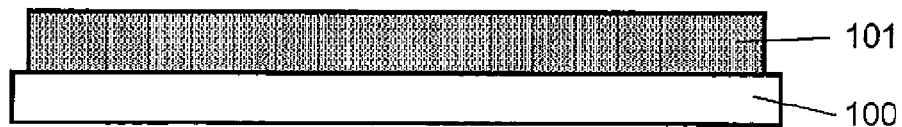
FIG. 2A is cross-sectional views showing a manufacturing method of major constituents of the resistance variable nonvolatile memory device according to Embodiment 1 of the present invention.

Initially, as shown in FIG. 2A, the first electrode 101 comprising platinum is formed on the substrate 100 provided with a transistor and a lower wire, using a desired mask.

Figure 2B:
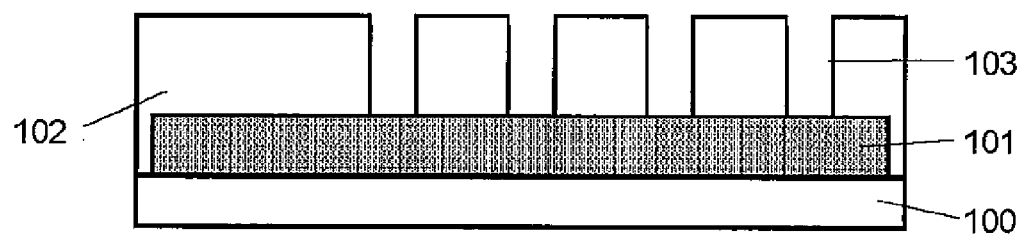
FIG. 2B is cross-sectional views showing a manufacturing method of major constituents of the resistance variable nonvolatile memory device according to Embodiment 1 of the present invention.

Then, as shown in FIG. 2B, the interlayer insulating layer 102 formed of the silicon oxide layer is formed over the entire surface to cover the first electrode 101, and an opening (memory cell hole) is formed to penetrate the interlayer insulating layer 102 such that the opening is connected to the first electrode 101.

Figure 2C:
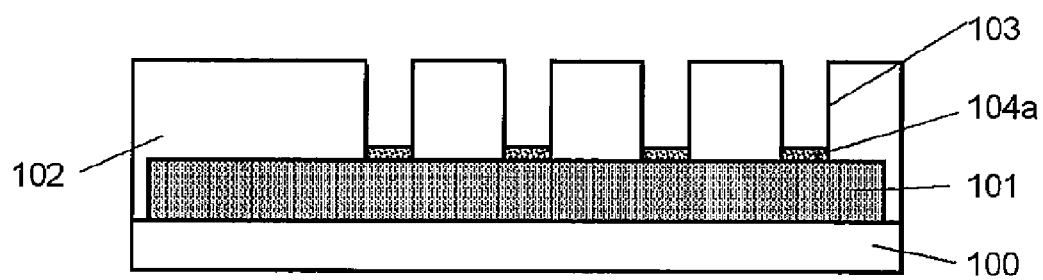
FIG. 2C is cross-sectional views showing a manufacturing method of major constituents of the resistance variable nonvolatile memory device according to Embodiment 1 of the present invention.

Then, as shown in FIG. 2C, metal (in this embodiment, tantalum is used) is selectively grown only on a portion of the first electrode 101 which is exposed at the bottom portion of the memory cell hole 103, by electroless plating. This metal is oxidized in oxygen atmosphere (400~450 degrees C.) to form the first resistance variable layer 104a comprising tantalum oxide. Because of perfect oxidization, the first resistance variable layer 104a has an oxygen content of about 72 atm % which is close to a stoichiometry (stoichiometric composition) of $Ta_2O_5$. In this embodiment, thermal oxidization that provides high efficiency, is used to perfectly oxidize the metal into the metal oxide.

Figure 2D:
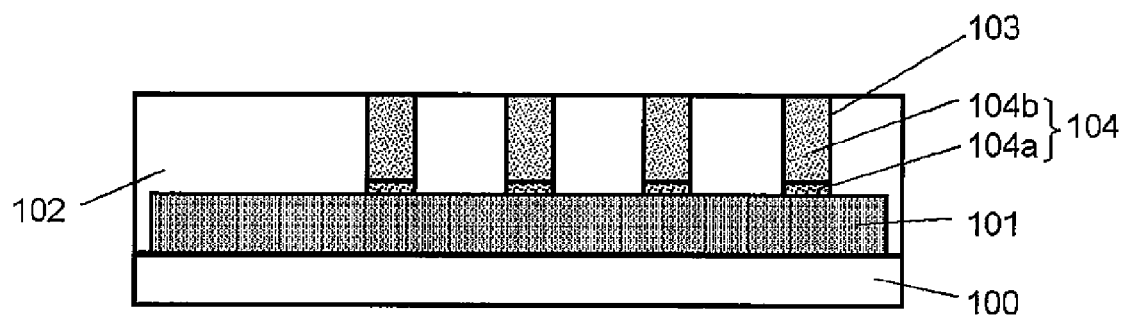
FIG. 2D is cross-sectional views showing a manufacturing method of major constituents of the resistance variable nonvolatile memory device according to Embodiment 1 of the present invention.

Then, as shown in FIG. 2D, the tantalum oxide of the second resistance variable layer 104b which is lower in oxygen content than the first resistance variable layer 104a is deposited into the memory cell hole, by reactive sputtering in which sputtering is performed using a tantalum target in argon and oxygen gas atmosphere. The second resistance variable layer 104b has an oxygen content of about 65 atm %. Sputtering continues until the memory cell hole 103 is filled with the second resistance variable layer 104b. Then, an unnecessary portion of tantalum oxide which is present on the interlayer insulating layer 102 is removed by CMP to form the second resistance variable layer 104b only inside the memory cell hole 103. In the same manner, hafnium oxide can be deposited by reactive sputtering in which sputtering is performed using a hafnium target in the argon and oxygen gas atmosphere.

Through the process steps of FIGS. 2C and 2D, the resistance variable layer is deposited over the entire surface of a wafer including the interior of the memory cell hole, because the memory cell hole has already been patterned. After that, merely by removing an unnecessary portion of the resistance variable layer which is present outside the memory cell hole by CMP, patterning of the resistance variable layer is complete. Thus, because of the omission of an etching step, the resistance variable layer can be formed without performing etching which might cause a reaction with an etching gas, damages due to redox, and damages due to charging, in principle.

Figure 3A:
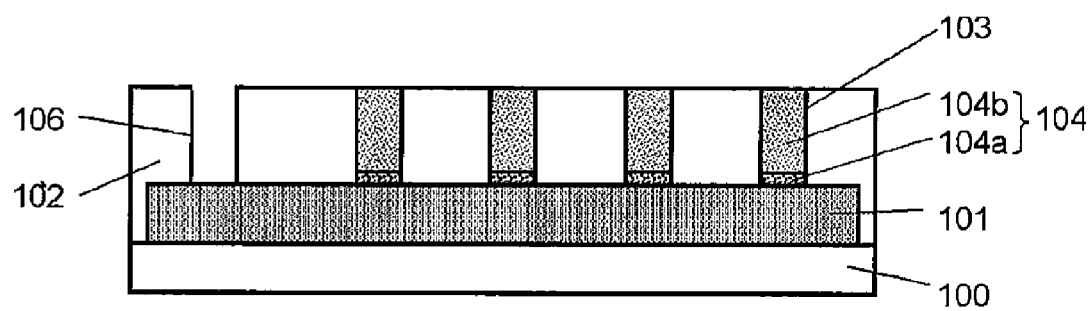
FIG. 3A is cross-sectional views showing a manufacturing method of major constituents of the resistance variable nonvolatile memory device according to Embodiment 1 of the present invention.

Then, as shown in FIG. 3A, the opening (contact hole) is formed to penetrate the interlayer insulting layer 102 such that the opening is connected to the first electrode 101.

Figure 3B:
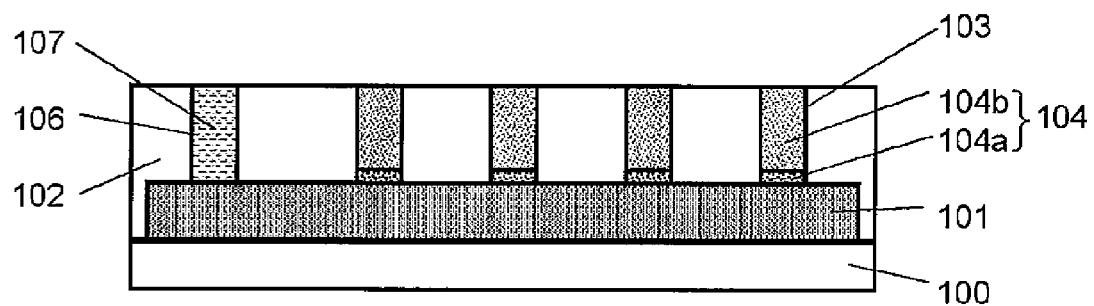
FIG. 3B is cross-sectional views showing a manufacturing method of major constituents of the resistance variable nonvolatile memory device according to Embodiment 1 of the present invention.

Then, as shown in FIG. 3B, an adhesive layer (upper layer titanium nitride/lower layer titanium; not shown) is deposited over the entire bottom portion and the entire side surface of the contact hole, inside the contact hole by sputtering, and further, tungsten is deposited by CVD. Then, by CMP, an unnecessary portion of tungsten which is present over the interlayer insulating layer 102 is removed, thereby forming the electrically-conductive plug 107 only inside the contact hole 106.

Figure 3C:
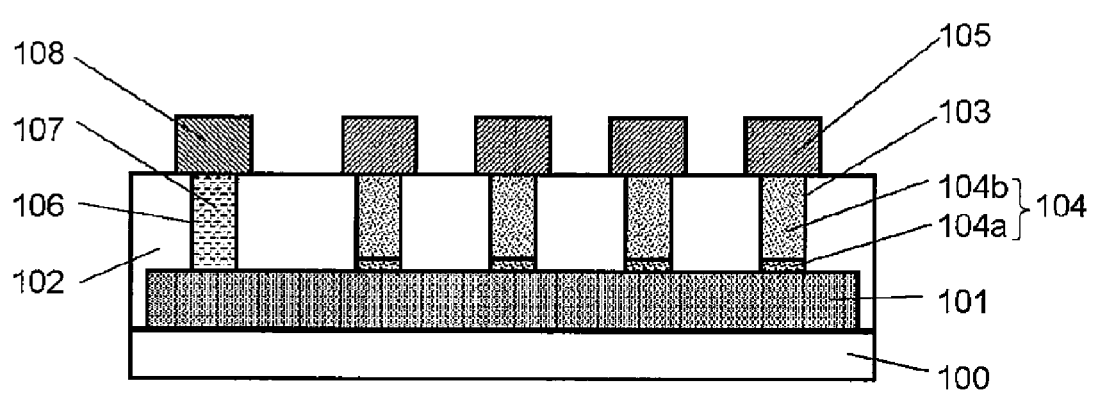
FIG. 3C is cross-sectional views showing a manufacturing method of major constituents of the resistance variable nonvolatile memory device according to Embodiment 1 of the present invention.

Finally, as shown in FIG. 3C, on the interlayer insulating layer 102, the second electrode 105 and the lead-out wire 108 are formed by patterning using a desired mask such that the second electrode 105 covers the second resistance variable layer 104b inside the memory cell hole 103 and the lead-out wire 108 is connected to the electrically-conductive plug 107 only inside the contact hole 106. In the above described manufacturing method, the resistance variable element is configured to include the first electrode 101, the first resistance variable layer 104a, the second resistance variable layer 104b and the second electrode 105, and thus, it is possible to implement a resistance variable nonvolatile memory device which has a hole-filled structure suitable for a miniaturized configuration and performs a resistance changing operation stably.

Embodiment 2

Figure 4:
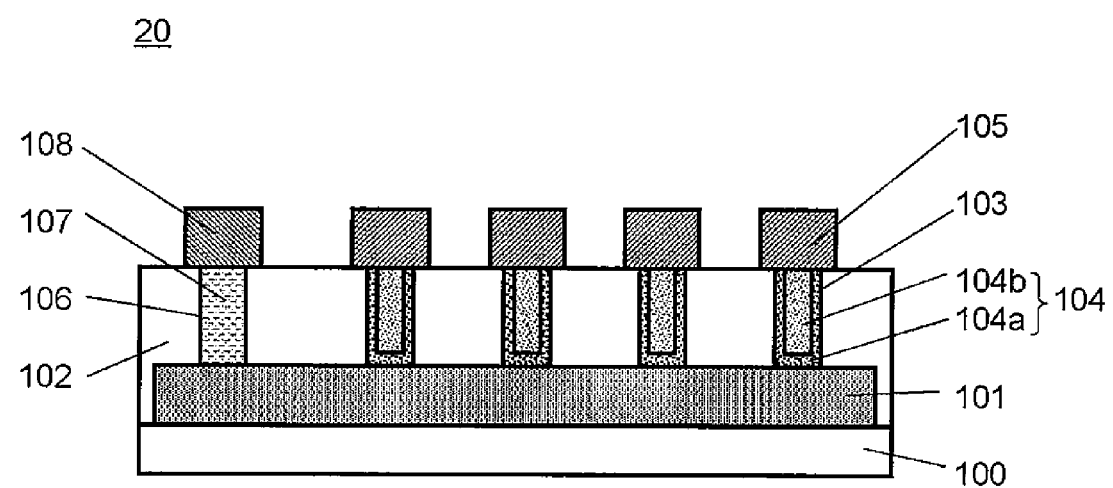
FIG. 4 is a cross-sectional view showing an exemplary configuration of a resistance variable nonvolatile memory device according to Embodiment 2 of the present invention.

FIG. 4 is a cross-sectional view showing an exemplary configuration of a resistance variable nonvolatile memory device 20 according to Embodiment 2 of the present invention. The resistance variable nonvolatile memory device 20 according to Embodiment 2 is different from the resistance variable nonvolatile memory device 10 according to Embodiment 1 in that the first resistance variable layer 104a of the resistance variable element is formed on the side wall of the memory cell hole 103, as well as the bottom portion of the memory cell hole 103. In a plan view, the first resistance variable layer 104a is formed along the inner wall of the memory cell hole 103 in a ring shape, and further the second resistance variable layer 104b is formed inwardly of the first resistance variable layer 104a. Since the first resistance variable layer 104a has a higher oxygen content and a relatively higher resistance than the second resistance variable layer 104b, a cell current does not substantially flow through the first resistance variable layer 104a formed on the side wall of the memory cell hole 103. Since the cell current flows intensively through the second resistance variable layer 104b with a relatively low resistance which is formed inwardly of the first resistance variable layer 104a, resistance change is allowed to occur more stably at the bottom portion of the memory cell hole in the vicinity of its center. Since a current flowing area decreases, the cell current and electric power consumption can be reduced effectively. Since the first resistance variable layer is disposed on the side wall of the memory cell as well as the bottom portion of the memory cell, the resistance variable layer can be deposited by sputtering, CVD, etc., which results in an advantage in the manufacturing method. The other representative constituents of the resistance variable nonvolatile memory device 20 are similar to those of the resistance variable nonvolatile memory device 10, and will not be described repetitively.

Hereinafter, the characteristic of the resistance variable element itself including the resistance variable layer 104 comprising tantalum oxide (about 50 nm in thickness) will be described.

Figure 5A:
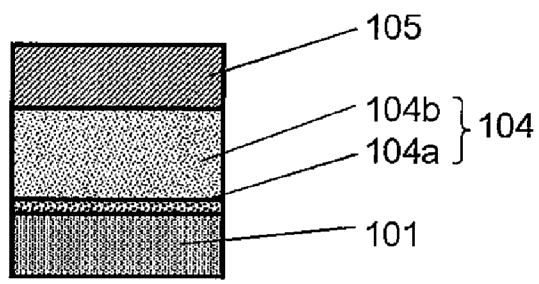
FIG. 5A is a view showing a resistance variable element having a simplified structure.
Figure 5B:
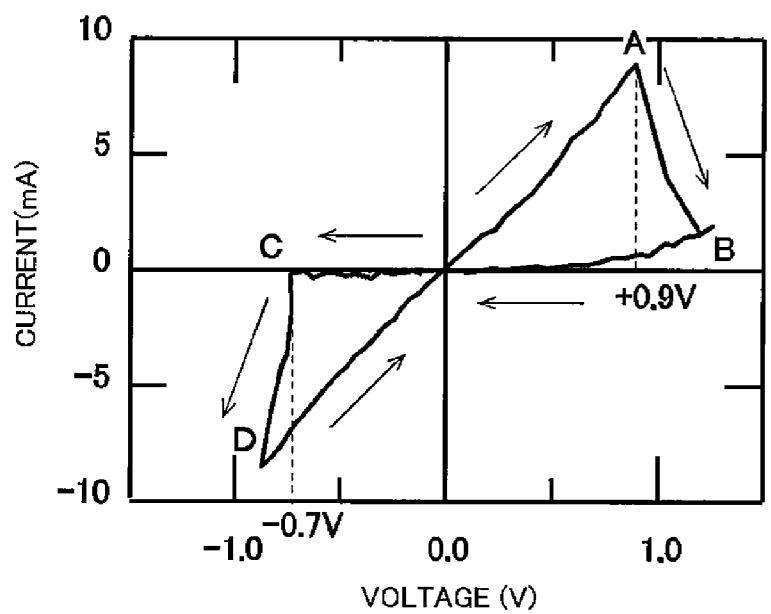
FIG. 5B is a graph showing a current-voltage characteristic of the element.
Figure 5C:
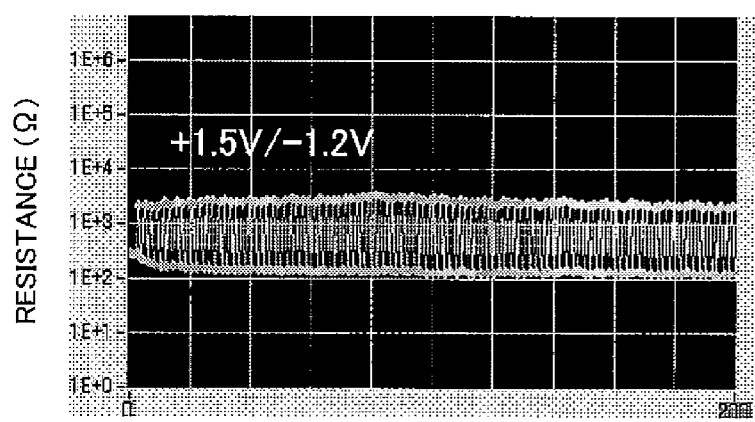
FIG. 5C is a graph showing a resistance changing characteristic of the element.

FIG. 5A is a view showing a configuration of a resistance variable element having a simplified structure evaluated in the present case, FIG. 5B is a graph showing a current-voltage characteristic of the element, and FIG. 5C is a graph showing resistance change of the element which occurs in response to electric pulses. As shown in FIG. 5A, the first resistance variable layer 104a with a higher oxygen content and the second resistance variable layer 104b with a lower oxygen content are formed in this order on the first electrode 105, and further the second electrode 105 is formed thereon. As shown in FIG. 5B, in a case where a positive electric potential is applied (positive voltage is applied to the first electrode 101 on the basis of the electric potential of the second electrode 105) to the first electrode 101, the element changes from a low-resistance state to a high-resistance state at point A. In this case, the element initiates changing of its resistance at a voltage of about +0.9V. Under this state, then, when a negative electric potential is applied (negative voltage is applied to the first electrode 101 on the basis of the electric potential of the second electrode 105) to the first electrode 101, the element changes from the high-resistance state to the low-resistance state at point C. In this case, the element initiates changing its resistance at a voltage of about −0.7V. Thus, the element exhibits a resistance changing characteristic in which the element changes between the two states, i.e., the high-resistance state and the low-resistance state, by applying voltages with different polarities. FIG. 5C shows a measurement result in a case where an electric pulse having a voltage of +1.5V and a pulse width of 100 nsec and an electric pulse having a voltage of −1.2V and a pulse width of 100 nsec are applied to the first electrode 101 on the basis of the second electrode 105, between the first electrode 101 and the second electrode 105. In this case, the resistance value becomes about 1200 to 1500Ω by applying the electric pulse of the voltage of +1.5V, while the resistance value becomes about 150Ω by applying the electric pulse of the voltage of −1.2V. Thus, it can be seen that the resistance value changes with a magnitude of about one-digit.

FIGS. 6A to 6D and FIGS. 7A to 7C are cross-sectional views showing a manufacturing method of major constituents of the resistance variable nonvolatile memory device 20 according to Embodiment 2. The manufacturing method will be described with reference to these Figures.

Figure 6A:
FIG. 6A is cross-sectional views showing a manufacturing method of major constituents of the resistance variable nonvolatile memory device according to Embodiment 2 of the present invention.

Initially, as shown in FIG. 6A, the first electrode 101 comprising platinum is formed on the substrate 100 provided with the transistor and the lower wire, using a desired mask.

Figure 6B:
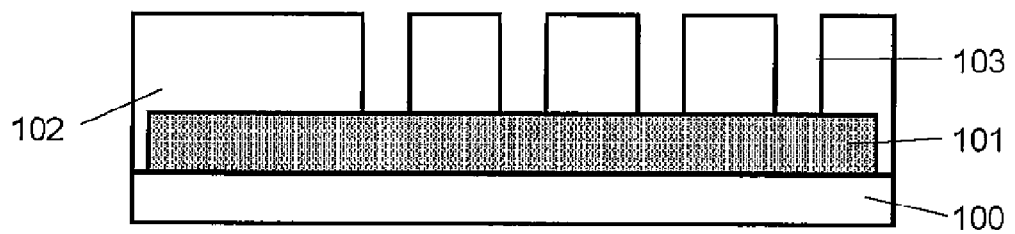
FIG. 6B is cross-sectional views showing a manufacturing method of major constituents of the resistance variable nonvolatile memory device according to Embodiment 2 of the present invention.

Then, as shown in FIG. 6B, the interlayer insulating layer 102 formed of the silicon oxide layer is formed over the entire surface to cover the first electrode 101, and the opening (memory cell hole) is formed to penetrate the interlayer insulating layer 102 such that the opening is connected to the first electrode 101.

Figure 6C:
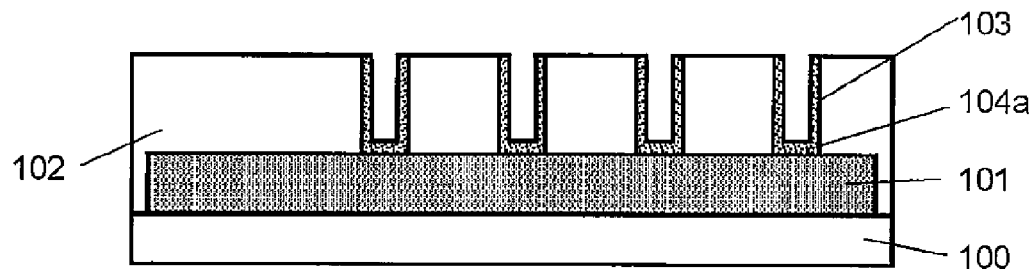
FIG. 6C is cross-sectional views showing a manufacturing method of major constituents of the resistance variable nonvolatile memory device according to Embodiment 2 of the present invention.

Then, as shown in FIG. 6C, tantalum oxide is deposited at the bottom portion of the memory cell hole 103, on the side wall of the memory cell hole 103, and on the interlayer insulating layer 102, by so-called reactive sputtering in which sputtering is performed using a tantalum target in argon and oxygen gas atmosphere. Then, an unnecessary portion of tantalum oxide which is present over the interlayer insulating layer 102 is removed by CMP, thereby forming the first resistance variable layer 104a only at the bottom portion and the side wall of the memory cell hole 103, inside the memory cell hole 103. In the reactive sputtering, the oxygen content can be increased by setting an oxygen flow rate higher during deposition. In the present case, the first resistance variable layer 104a is deposited with an oxygen content of about 72 atm % under the condition in which the flow rate of argon is 34 sccm, the flow rate of oxygen is 24 sccm, and a power is 1.6 kW.

Figure 6D:
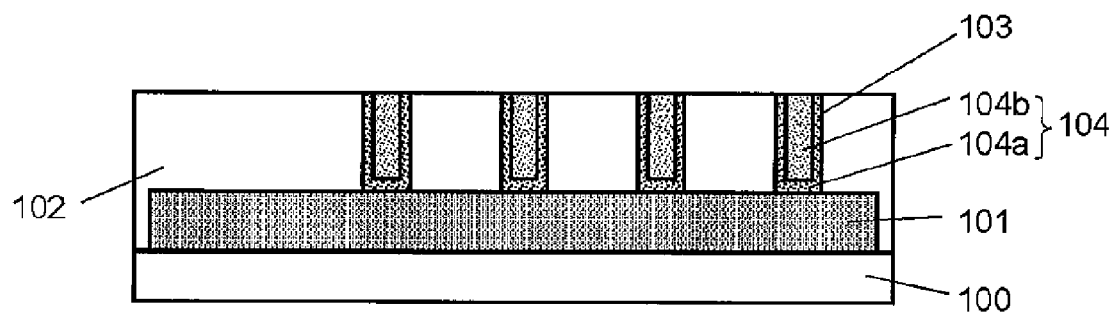
FIG. 6D is cross-sectional views showing a manufacturing method of major constituents of the resistance variable nonvolatile memory device according to Embodiment 2 of the present invention.

Then, as shown in FIG. 6D, tantalum oxide of the second resistance variable layer 104b with a lower oxygen content than the first resistance variable layer 104a is formed inside the memory cell hole formed with the first resistance variable layer 104a on a surface thereof. Similarly to the formation of the first resistance variable layer 104a, the second resistance variable layer 104b is deposited by the reactive sputtering. Sputtering continues until the memory cell hole 103 is completely filled with the second resistance variable layer 104b. Then, an unnecessary portion of tantalum oxide which is present over the interlayer insulating layer 102 is removed to form the second resistance variable layer 104b only inside the memory cell hole 103. In the present case, the second resistance variable layer 104b with an oxygen content of about 65 atm % is deposited under the condition in which the flow rate of argon is 34 sccm, the flow rate of oxygen is 20.5 sccm, and a power is 1.6 kW.

Through the process steps of FIGS. 6C and 6D, the resistance variable layer is deposited over the entire surface of the wafer including the interior of the memory cell hole, because the memory cell hole has already been patterned. After that, merely by removing an unnecessary portion of the resistance variable layer which is present outside the memory cell hole by CMP, patterning of the resistance variable layer is complete. Thus, because of the omission of the etching step, the resistance variable layer can be formed without performing etching which might cause a reaction with an etching gas, damages due to redox, and damages due to charging, in principle.

Figure 7A:
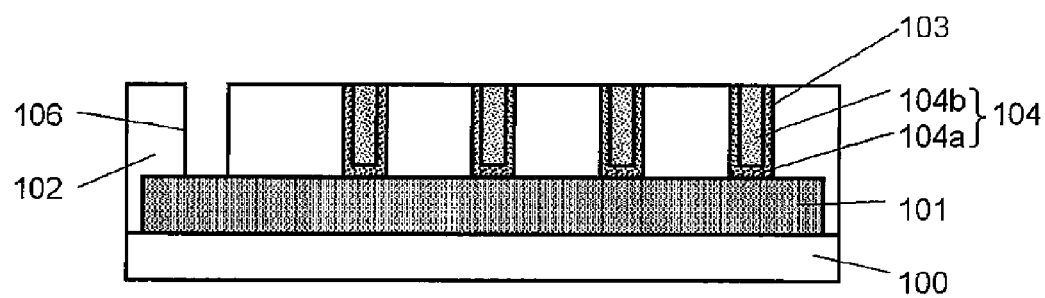
FIG. 7A is cross-sectional views showing a manufacturing method of major constituents of the resistance variable nonvolatile memory device according to Embodiment 2 of the present invention.

Then, as shown in FIG. 7A, the opening (contact hole) is formed to penetrate the interlayer insulating layer 102 such that the opening is connected to the first electrode 101.

Figure 7B:
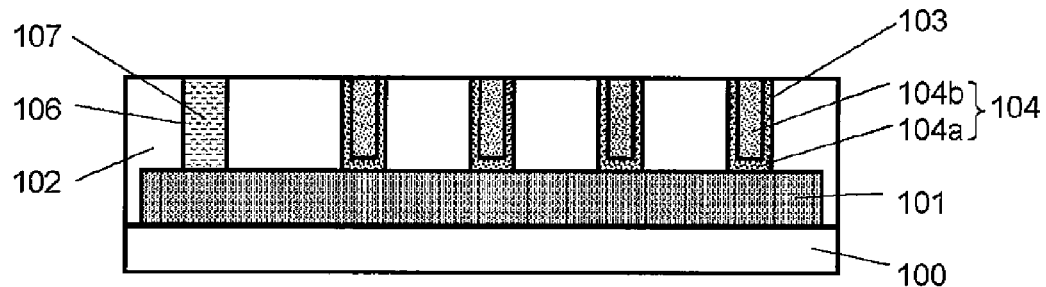
FIG. 7B is cross-sectional views showing a manufacturing method of major constituents of the resistance variable nonvolatile memory device according to Embodiment 2 of the present invention.

Then, as shown in FIG. 7B, the adhesive layer (upper layer titanium nitride/lower layer titanium; not shown) is deposited over the entire bottom portion and entire side surface of the contact hole, inside the contact hole, by sputtering, and further, tungsten is deposited by CVD. Then, by CMP, an unnecessary portion of tungsten, or the like, which is present over the interlayer insulating layer 102 is removed, thereby forming the electrically-conductive plug 107 only inside the contact hole 106.

Figure 7C:
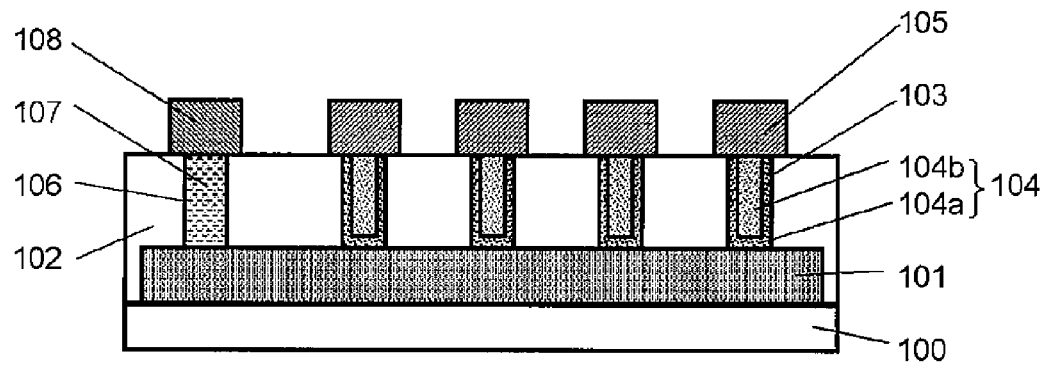
FIG. 7C is cross-sectional views showing a manufacturing method of major constituents of the resistance variable nonvolatile memory device according to Embodiment 2 of the present invention.

Finally, as shown in FIG. 7C, on the interlayer insulating layer 102, the second electrode 105 and the lead-out wire 108 are formed by patterning using a desired mask in such a manner that the second electrode 105 covers the first resistance variable layer 104a and the second resistance variable layer 104b inside the memory cell hole 103 and the lead-out wire 108 is connected to the electrically-conductive plug 107 inside the contact hole 106. In the above described manufacturing method, the resistance variable element is configured to include the first electrode 101, the first resistance variable layer 104a, the second resistance variable layer 104b and the second electrode 105, and thus, it is possible to implement a resistance variable nonvolatile memory device which has a hole-filled structure suitable for a miniaturized configuration and performs a resistance changing operation stably.

Embodiment 3

Figure 8:
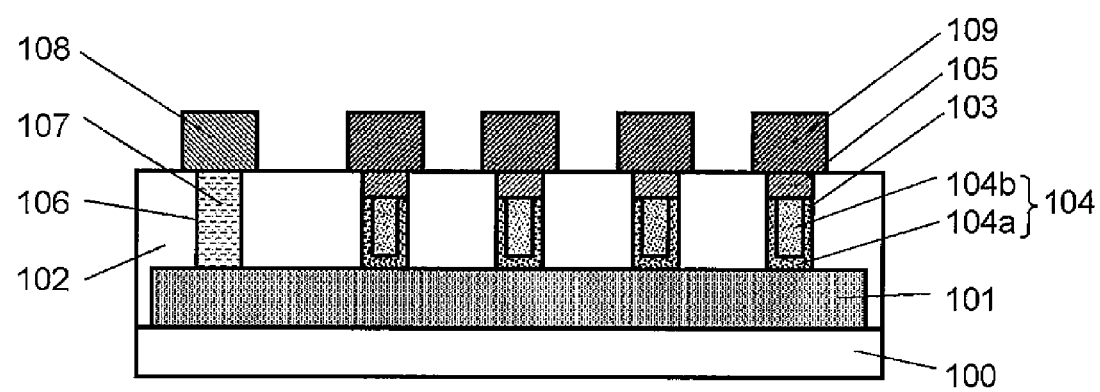
FIG. 8 is a cross-sectional view showing an exemplary configuration of a resistance variable nonvolatile memory device according to Embodiment 3 of the present invention.

FIG. 8 is a cross-sectional view showing an exemplary configuration of a resistance variable nonvolatile memory device 30 according to Embodiment 3 of the present invention. The resistance variable nonvolatile memory device 30 according to Embodiment 3 is different from the resistance variable nonvolatile memory device 20 according to Embodiment 2 in that the second electrode 105 is filled into the upper portion of the memory cell hole 103. Furthermore, a third electrode 109 is formed to be connected to the second electrode 105.

In accordance with such a configuration, the thickness of the second resistance variable layer 104b, which corresponds to the second electrode 105 (20~100 nm in thickness) filled into the memory cell hole, can be reduced. This intensifies the electric field in the first resistance variable layer 104a and the electric field in the second resistance variable layer 104b. Therefore, the resistance variable nonvolatile memory device 30 is operative at lower voltages. In this embodiment, tantalum nitride is used as the second electrode 105 because it is easily filled into the memory cell hole 103 and its standard electrode potential is relatively low. Although an electrically-conductive material containing aluminum as a major component is used as the third electrode, in order to suppress an increase in a wire resistance, an electrically-conductive material containing copper as a major component may be used in a damascene process. As described above, the material of the second electrode 105 and the material of the third electrode 109 may be selectable according to the use. The other representative constituents of the resistance variable nonvolatile memory device 30 are similar to those of the resistance variable nonvolatile memory device 20 described in Embodiment 2, and will not be described repetitively.

Figure 9A:
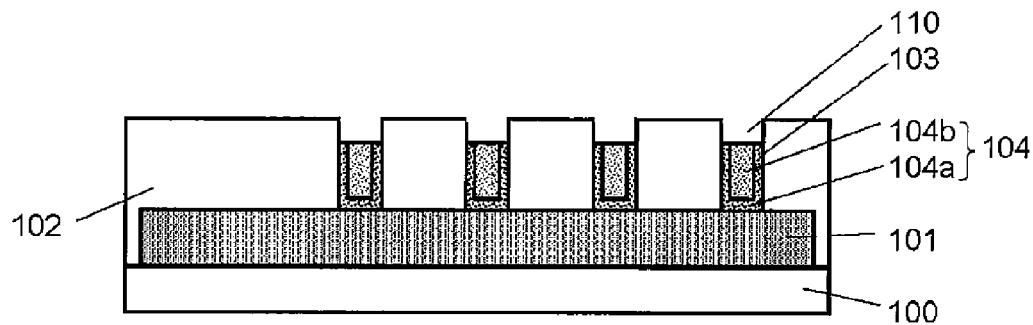
FIG. 9A is cross-sectional views showing a manufacturing method of major constituents of the resistance variable nonvolatile memory device according to Embodiment 3 of the present invention.

FIGS. 9A to 9D are cross-sectional views showing a manufacturing method of major constituents of the resistance variable nonvolatile memory device 30 according to Embodiment 3. With reference to these Figures, the manufacturing method will be described. The manufacturing steps before the step of FIG. 9A are identical to those of FIGS. 6A to 6D, and will not be described.

After the step of FIG. 6D, as shown in FIG. 9A, a base layer including the first resistance variable layer 104a formed at the bottom portion and side wall of the memory cell hole 103, inside the memory cell hole 103, and the second resistance variable layer 104b filled inwardly of the first resistance variable layer 104a, is etched-back under the condition in which the first resistance variable layer 104a and the second resistance variable layer 104b are selectively etched with respect to the interlayer insulating layer 102. This results in a recess 110 in the layers filled into the memory cell hole 103. The recess has a depth of about 20~100 nm. Instead of the etchback, the recess 110 may be formed by over-polishing by CMP, following the step of FIG. 6D. In this case, it is more preferred that the interlayer insulating layer 102 have a stacked structure in which a silicon nitride layer which is less easily polished by CMP is disposed as an upper layer. This is because the silicon nitride layer is polished less easily under the condition used for polishing the first resistance variable layer 104a comprising metal oxide and the second resistance variable layer 104b comprising metal oxide, and therefore, formation of the recess 110 is facilitated.

Figure 9B:
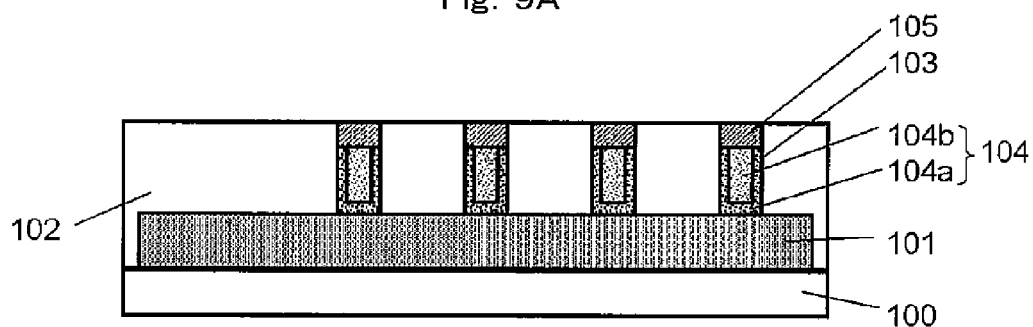
FIG. 9B is cross-sectional views showing a manufacturing method of major constituents of the resistance variable nonvolatile memory device according to Embodiment 3 of the present invention.

Then, as shown in FIG. 9B, tantalum nitride is formed over the entire surface to cover the recess 110 of the memory cell hole 103, and an unnecessary portion of tantalum nitride which is present the interlayer insulating layer 102 is removed by CMP, thereby forming the second electrode 105 comprising tantalum nitride only inside the memory cell hole 103. The tantalum nitride is deposited by so-called reactive sputtering in which sputtering is performed using a tantalum target in argon and nitrogen gas atmosphere.

Figure 9C:
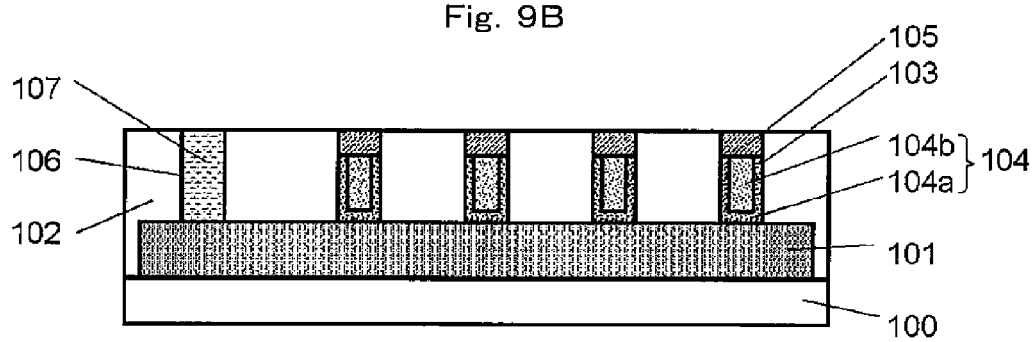
FIG. 9C is cross-sectional views showing a manufacturing method of major constituents of the resistance variable nonvolatile memory device according to Embodiment 3 of the present invention.

Then, as shown in FIG. 9C, the contact hole 106 is firstly formed to penetrate the interlayer insulating layer 102 such that the contact hole 106 is connected to the first electrode 101. After that, the adhesive layer (upper layer titanium nitride/lower layer titanium; not shown) is deposited over the entire surface by sputtering, and then, tungsten is deposited by CVD. Then, by CMP, an unnecessary portion of tungsten, or the like which is present over the interlayer insulating layer 102 is removed, thereby forming the electrically-conductive plug 107 only inside the contact hole 106.

Figure 9D:
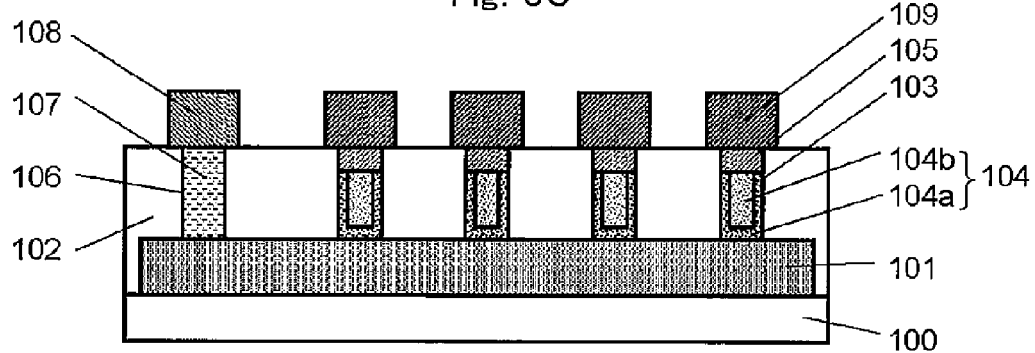
FIG. 9D is cross-sectional views showing a manufacturing method of major constituents of the resistance variable nonvolatile memory device according to Embodiment 3 of the present invention.

Finally, as shown in FIG. 9D, on the interlayer insulating layer 102, the third electrode 109 and the lead-out wire 108 are formed by patterning using a desired mask such that the third electrode 109 is connected to the second electrode 105 inside the memory cell hole 103 and the lead-out wire 108 is connected to the electrically-conductive plug 107 inside the contact hole 106. Aluminum with a low resistivity is used as the third electrode 109 and the lead-out wire 108. In the above described manufacturing method, the resistance variable element is configured to include the first electrode 101, the first resistance variable layer 104a, the second resistance variable layer 104b and the second electrode 105, and thus, it is possible to implement a resistance variable nonvolatile memory device which has a hole-filled structure suitable for a miniaturized configuration and performs a resistance changing operation stably.

Embodiment 4

Figure 10A:
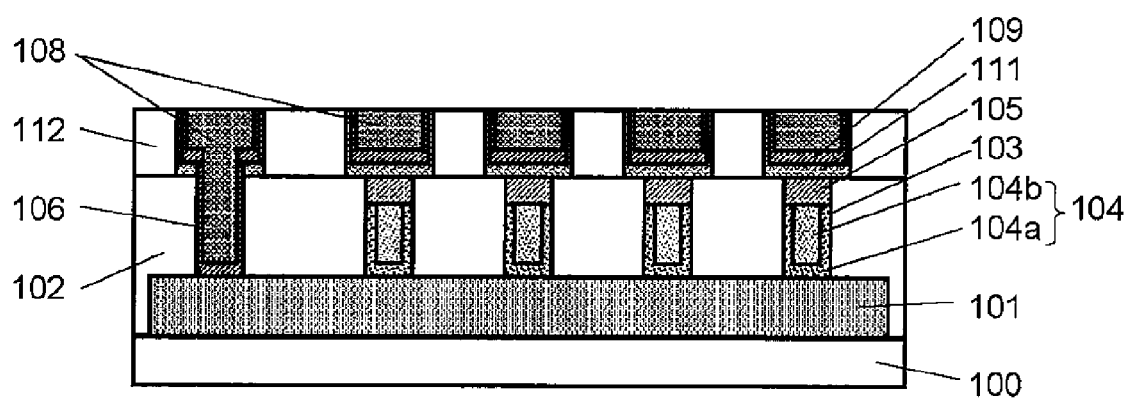
FIG. 10A is cross-sectional views showing an exemplary configuration of a resistance variable nonvolatile memory device according to Embodiment 4 of the present invention.
Figure 10B:
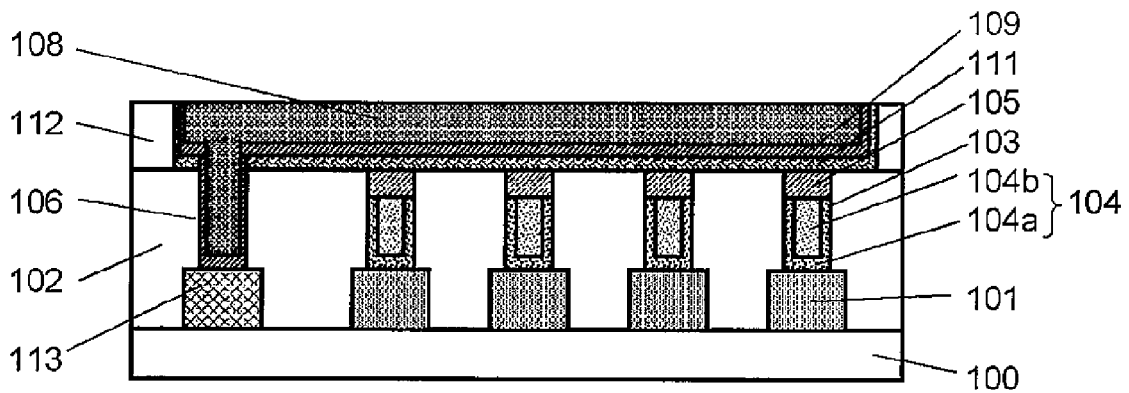
FIG. 10B is cross-sectional views showing an exemplary configuration of a resistance variable nonvolatile memory device according to Embodiment 4 of the present invention.
Figure 11:
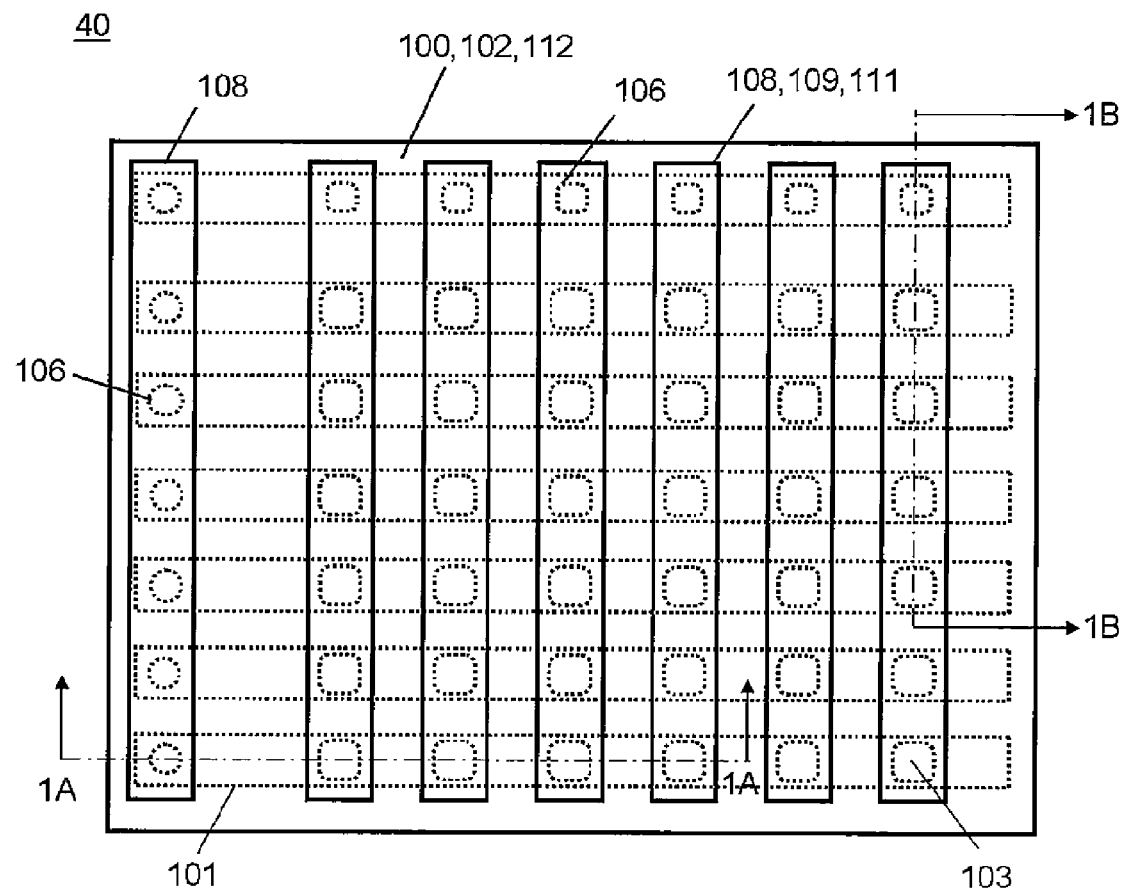
FIG. 11 is a plan view showing an exemplary configuration of a resistance variable nonvolatile memory device according to Embodiment 4 of the present invention.

FIGS. 10A and 10B are cross-sectional views showing an exemplary configuration of a resistance variable nonvolatile memory device 40 according to Embodiment 4 of the present invention. FIG. 11 is a plan view showing an exemplary configuration of the resistance variable nonvolatile memory device according to Embodiment 4 of the present invention. FIG. 10A shows the cross-section taken in the direction of arrows along one-dotted line of 1A-1A in FIG. 11, while FIG. 10B shows the cross-section taken in the direction of arrows along one-dotted line of 1B-1B in FIG. 11. As can be seen from the plan view of FIG. 11 in Embodiment 4, memory cell holes 103 are formed at locations where a plurality of first electrodes 101 formed in a stripe shape to extend in parallel with each other cross a plurality of third electrodes 109 formed in a stripe shape to extend in parallel with each other.

As shown in FIGS. 10A and 10B, the resistance variable nonvolatile memory device 40 of Embodiment 4 includes the substrate 100 provided with the first electrode 101, the interlayer insulating layer 102 provided over the substrate 100 and formed of a silicon oxide layer (150~500 nm in thickness) to cover the first electrode 101, the memory cell hole 103 (50~300 nm dia.) penetrating the interlayer insulating layer 102 and electrically connected to the first electrode 101, and the contact hole 106 (50~300 nm dia.) penetrating the interlayer insulating layer 102 and electrically connected to the first electrode 101. The first resistance variable layer 104a (1~10 nm in thickness) is formed at the bottom portion and side wall of the memory cell hole 103 such that the first resistance variable layer 104a is in contact with the first electrode 101, and the second resistance variable layer 104b is formed at the upper side and inwardly of the first resistance variable layer 104a. A recess (20~100 nm in depth) is provided in the upper portion of the layers filled into the memory cell hole 103. The second electrode 105 is filled into the recess to cover the first resistance variable layer 104a and the second resistance variable layer 104b. Further, over the interlayer insulating layer 102, an inter-wire interlayer insulating layer 112 formed of a silicon oxide layer is formed. A semiconductor layer 111 is formed at the bottom portion and side wall of a wire trench formed in the inter-wire interlayer insulating layer to cover the second electrode 105. The third electrode 109 is formed to cover at least the semiconductor layer 111 over the second electrode 105.

In the contact hole 106 formed inside the interlayer insulating layer 102, the lead-wire 108 comprising copper is formed on the third electrode 109 as the adhesive layer. The lead-wire 108 includes a wire and a contact plug which are integral with each other and extends up to a location above the memory cell hole 103. The resistance variable element is configured to include the first electrode 101, the first resistance variable layer 104a, the second resistance variable layer 104b, and the second electrode 105, while a diode element is configured to include the second electrode 105, the semiconductor layer 111, and the third electrode 109.

When the above described resistance variable nonvolatile memory device is seen in a plan view, as shown in FIG. 11, lower wire layers each including the first electrode 101 respectively have a stripe shape and upper wire layers each including the third electrode 109, the semiconductor layer 111, and the lead-wire 108 respectively have a stripe shape, and the lower wire layers cross the upper wire layers, respectively at a right angle. At each of cross-points of the lower wire layers and the upper wire layers, the resistance variable layer and diode element are formed via the memory cell hole 103. The first electrode 101 is connected to the lead-out wire 108 via the contact hole 106. Thus, a cross-point memory array is formed.

In the above configuration, the resistance variable element can be filled into the bottom portion of the memory cell hole 103 and the bidirectional diode element having a structure in which the semiconductor layer 111 is sandwiched between the second electrode 105 and the third electrode 109, can be formed into the upper portion of the memory cell hole. This makes it possible to implement a resistance variable nonvolatile memory device which enables achievement of a larger capacity and higher-dense integration, without providing the switching element such as the transistor. In addition, since the first resistance variable layer 104a with a higher oxygen content is disposed at the bottom portion of the memory cell hole 103 such that the first resistance variable layer 104a is connected to the first electrode 101, and the second resistance variable layer 104*b* with a lower oxygen content is disposed at the upper side of the first resistance variable layer 104*a*, resistance change is allowed to occur surely in a region of the interface with the first electrode 101, and the polarity with which resistance change occurs is always stabilized. As a result, a stable memory characteristic is attained. Furthermore, in the above diode element configuration, an area of a portion of the third electrode 109 and a portion of the semiconductor layer 111 which are in contact with each other is larger than an area of a portion of the second electrode 105 and a portion of the semiconductor layer 111 which are in contact with each other. Therefore, a line of electric force spreads to a location in the vicinity of the second electrode 105, and a current drivability can be increased. In the manner as described above, a current necessary and sufficient to allow resistance change to occur stably, can be ensured.

In the diode element configuration, tantalum nitride is used as the second electrode 105 and the third electrode 109, and a nitrogen-deficient silicon nitride layer is used as the semiconductor layer 111. A work function of the tantalum nitride is 4.76 eV which is sufficiently higher than 3.78 eV which is electron affinity of silicon. Because of this, a Schottky barrier is formed at an interface between them, and a bidirectional MSM diode is implemented. In addition, as described above, the standard electrode potential of the second electrode 105 comprising tantalum nitride is lower than the standard electrode potential of the first electrode to prevent the resistance change of the resistance variable element from occurring in the region at the second electrode 105 side. The second electrode 105 comprising tantalum nitride has high compatibility (high adhesivity) when it is used as a seed layer for the lead-out wire 108. The other representative constituents of the resistance variable nonvolatile memory device 40 are similar to those of the resistance variable nonvolatile memory device 20, and will not be described repetitively.

Figure 12A:
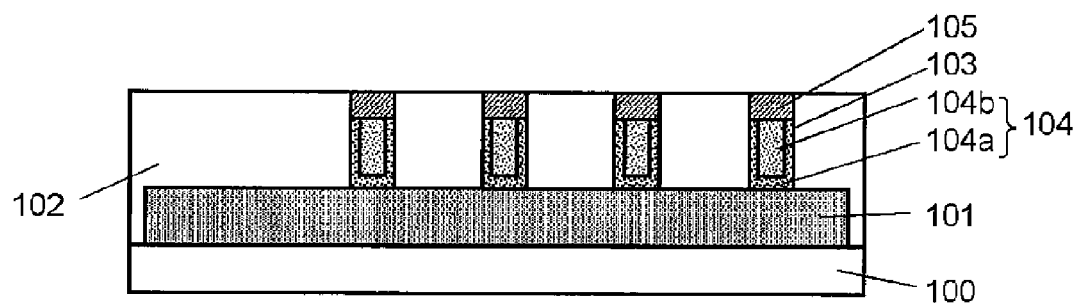
FIG. 12A is cross-sectional views showing a manufacturing method of major constituents of the resistance variable nonvolatile memory device according to Embodiment 4 of the present invention.

FIGS. 12A to 12D and FIGS. 13A to 13D are cross-sectional views showing a manufacturing method of major constituents of the resistance variable nonvolatile memory device 40 according to Embodiment 4. With reference to these Figures, the manufacturing method will be described. The manufacturing steps before the step of FIG. 12A are identical to those of FIGS. 6A to 6D and those of FIGS. 9A and 9B, and will not be described.

FIG. 12A is identical to FIG. 9B described above. To be specific, as shown in FIG. 12A, tantalum nitride is formed over the entire surface to cover the recess of the memory cell hole 103, and then an unnecessary portion of tantalum nitride which is present over the interlayer insulating layer 102 is removed by CMP, thereby forming the second electrode 105 comprising tantalum nitride only inside the memory cell hole 103.

Figure 12B:
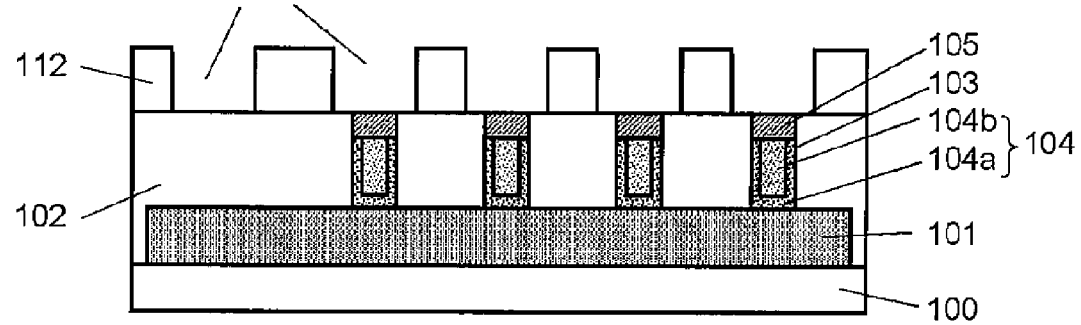
FIG. 12B is cross-sectional views showing a manufacturing method of major constituents of the resistance variable nonvolatile memory device according to Embodiment 4 of the present invention.

Then, as shown in FIG. 12B, the inter-wire insulating layer 112 (100~300 nm in thickness) formed of the silicon oxide layer is deposited over the interlayer insulating layer 102, and a wire trench 108*a* into which the lead-out wire 108 or the like will be filled later is patterned using a desired mask. At this time, in the bottom portion of the wire trench 108*a*, the second electrode 105 is exposed.

Figure 12C:
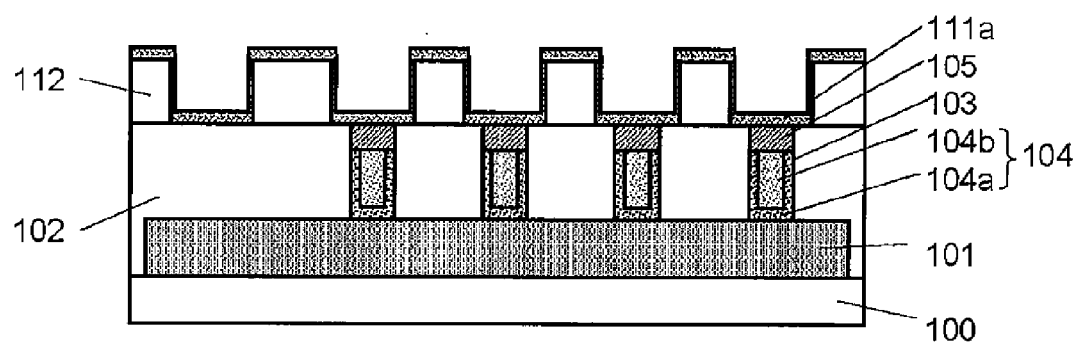
FIG. 12C is cross-sectional views showing a manufacturing method of major constituents of the resistance variable nonvolatile memory device according to Embodiment 4 of the present invention.

Then, as shown in FIG. 12C, a semiconductor layer 111*a* formed of a nitrogen-deficient silicon nitride layer is deposited over the entire surface including the wire trench 108*a* in which the second electrode 105 is exposed. The nitrogen-deficient silicon nitride layer is deposited by so-called reactive sputtering in which sputtering is performed using a silicon target in argon and nitrogen gas atmosphere. The nitrogen content of the nitrogen-deficient silicon nitride layer is 25~40 atm %.

Figure 12D:
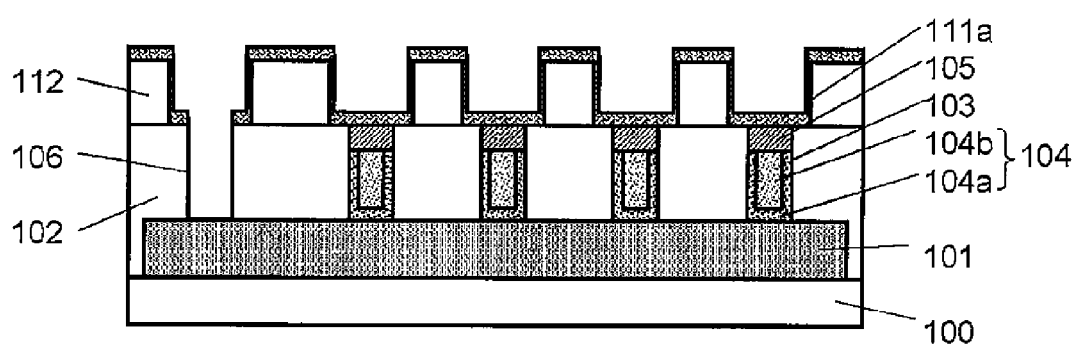
FIG. 12D is cross-sectional views showing a manufacturing method of major constituents of the resistance variable nonvolatile memory device according to Embodiment 4 of the present invention.

Then, as shown in FIG. 12D, the opening (contact hole) 106 is formed to penetrate the interlayer insulating layer 102 and the semiconductor layer 111*a* formed into the wire trench 108*a* such that the opening is connected to the first electrode 101.

Figure 13A:
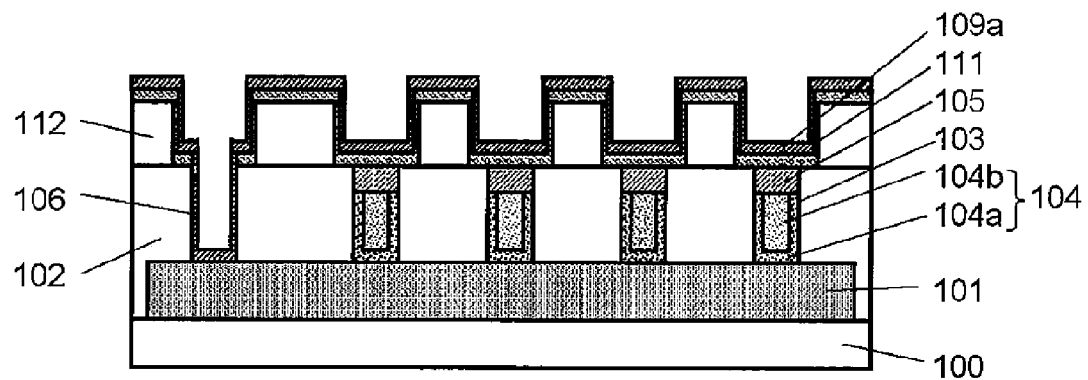
FIG. 13A is cross-sectional views showing a manufacturing method of major constituents of the resistance variable nonvolatile memory device according to Embodiment 4 of the present invention.

Then, as shown in FIG. 13A, a third electrode 109*a* comprising tantalum nitride is formed over the entire surface to cover the semiconductor layer 111*a* over the wire trench 108*a* and over the inter-wire insulating layer 112, and the contact hole 106.

Figure 13B:
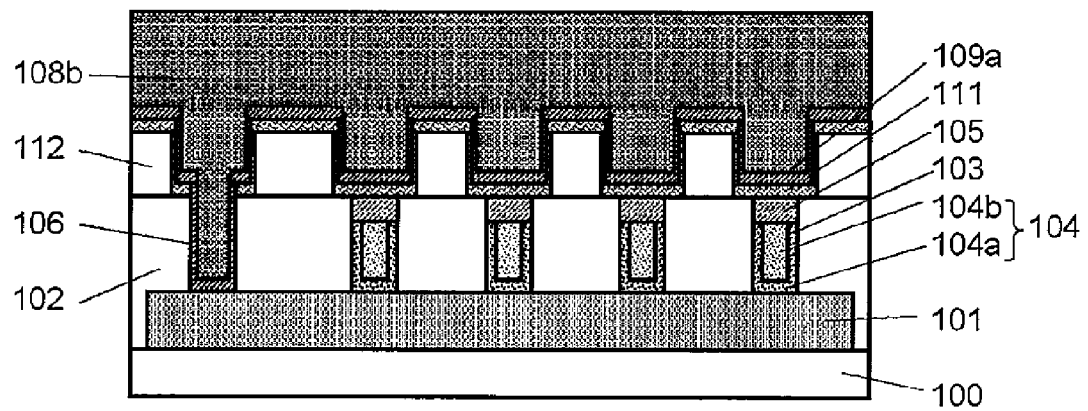
FIG. 13B is cross-sectional views showing a manufacturing method of major constituents of the resistance variable nonvolatile memory device according to Embodiment 4 of the present invention.

Then, as shown in FIG. 13B, a lead-out wire layer 108*b* comprising copper is formed over the entire surface to cover the third electrode 109*a* over the wire-trench 108*a*, over the inter-wire insulating layer 112 and over the contact hole 106.

Figure 13C:
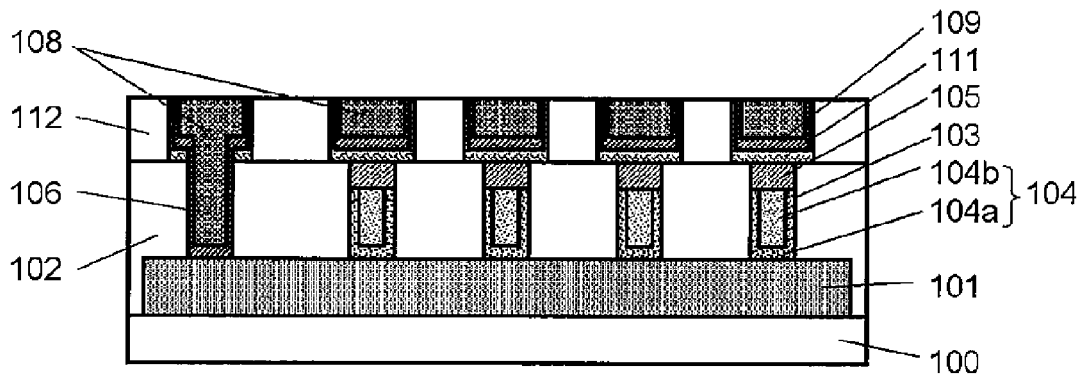
FIG. 13C is cross-sectional views showing a manufacturing method of major constituents of the resistance variable nonvolatile memory device according to Embodiment 4 of the present invention.
Figure 14A:
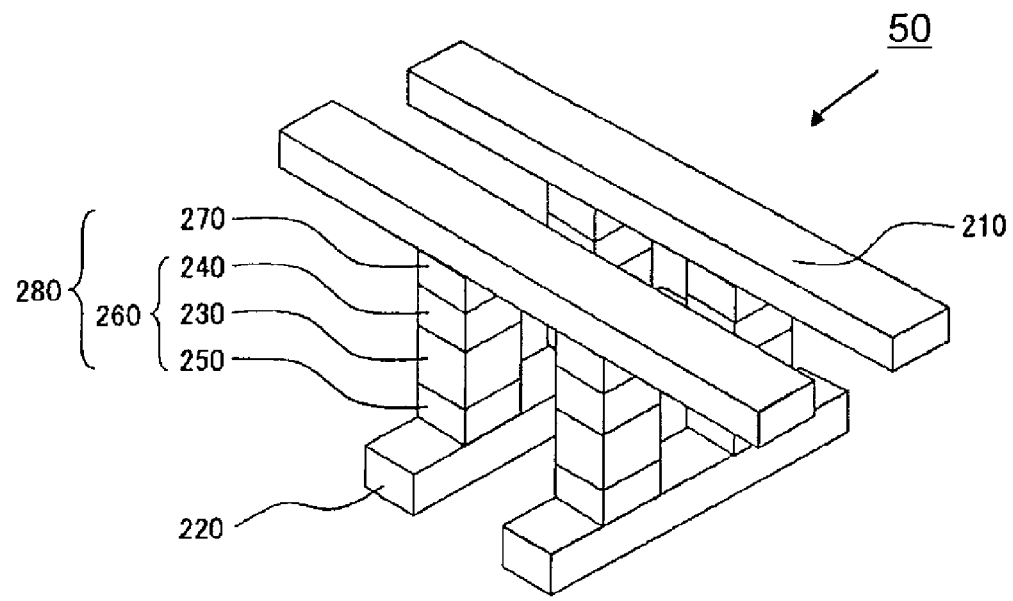
FIG. 14A is cross-sectional views of a conventional general nonvolatile memory device.
Figure 14B:
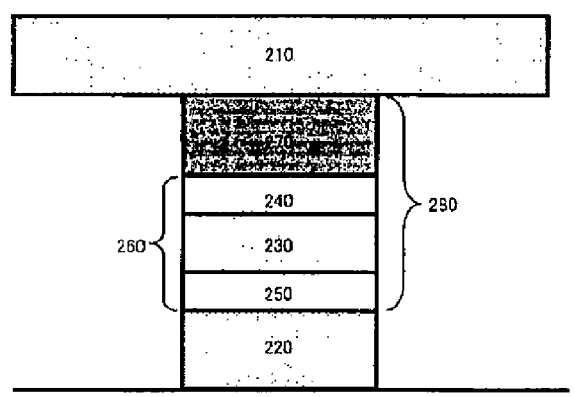
FIG. 14B is cross-sectional views of a conventional general nonvolatile memory device.

Finally, as shown in FIG. 13C, an unnecessary portion of copper, an unnecessary portion of the tantalum nitride, and an unnecessary portion of the nitrogen-deficient silicon nitride layer are removed by CMP, thereby forming the semiconductor layer 111 formed by the nitrogen-deficient silicon nitride layer, the third electrode 109 comprising the tantalum nitride, and the lead-out wire 108, only inside the wire trench 108*a*. Concurrently with this, the third electrode 109 comprising tantalum nitride and serving as the adhesive layer, and the lead-out wire 108 are formed inside the contact hole 106.

In the above manufacturing method, the resistance variable element is configured to include the first electrode layer 101, the first resistance variable layer 104*a*, the second resistance variable layer 104*b* and the second electrode 105. Since the resistance change is allowed to occur surely in the region of the interface with the first electrode 101, and the polarity with which the resistance change occurs is stabilized, a stable memory characteristic is attained. In addition, since the diode element is configured to include the second electrode 105, the semiconductor layer 111 and the third electrode 109 and is formed as a bidirectional diode at the upper portion of the memory cell hole, a switching element such as a transistor becomes unnecessary. In the above described manner, it is possible to implement a resistance variable nonvolatile memory device which has the hole-filled structure suitable for a miniaturized configuration and performs a resistance changing operation stably.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention provides the structure of a resistance variable nonvolatile memory device which is suitable for a miniaturized configuration, and a manufacturing method thereof. The present invention can implement a nonvolatile memory with a very large capacity and therefore is useful in a field of a variety of electronic equipment incorporating the nonvolatile memory device.

REFERENCE SIGNS LISTS

10, 20, 30, 40, 50 resistance variable nonvolatile memory device 100 substrate
101 first electrode
102 interlayer insulating layer
103 memory cell hole
104a first resistance variable layer
104b second resistance variable layer
105 second electrode
106 contact hole
107 electrically-conductive plug
108, 108a, 108b lead-out wire
109, 109a third electrode
110 recess in interlayer insulating layer
111, 111a semiconductor layer
112 inter-wire interlayer insulating layer
113 circuit connection wire
210 upper wire (bit line)
220 lower wire (word wire)
230 resistance variable layer
240 upper electrode
250 lower electrode
260 resistance variable element
270 non-linear element (varistor)
280 memory cell

The invention claimed is:

1. A resistance variable nonvolatile memory device comprising:
a substrate;
a first electrode formed on the substrate;
an interlayer insulating layer formed over the substrate and the first electrode;
a memory cell hole formed in the interlayer insulating layer on the first electrode;
a first resistance variable layer formed in at least a bottom portion of the memory cell hole and connected to the first electrode;
a second resistance variable layer formed inside the memory cell hole and located on the first resistance variable layer; and
a second electrode formed on the interlayer insulating layer to cover the second resistance variable layer;
the first resistance variable layer and the second resistance variable layer respectively comprising metal oxides of the same kind;
the first resistance variable layer having a higher oxygen content than the second resistance variable layer;
the first resistance variable layer being formed in at least a portion of a side wall of the memory cell hole, in addition to the bottom portion of the memory cell hole; and
the first resistance variable layer formed on the side wall of the memory cell hole extending in a ring shape along an inner wall of the memory cell hole in a cross-sectional view parallel to the substrate.

2. A resistance variable nonvolatile memory device comprising:
a substrate;
a first electrode formed on the substrate;
an interlayer insulating layer formed over the substrate and the first electrode;
a memory cell hole formed in the interlayer insulating layer on the first electrode;
a first resistance variable layer formed in at least a bottom portion of the memory cell hole and connected to the first electrode;
a second resistance variable layer formed inside the memory cell hole and located on the first resistance variable layer;
a second electrode formed inside the memory cell hole and located on the second resistance variable layer; and
a third electrode formed on the interlayer insulating layer to cover the second electrode;
the first resistance variable layer and the second resistance variable layer respectively comprising metal oxides of the same kind;
the first resistance variable layer having a higher oxygen content than the second resistance variable layer;
the first resistance variable layer being formed in at least a portion of a side wall of the memory cell hole, in addition to the bottom portion of the memory cell hole; and
the first resistance variable layer formed on the side wall of the memory cell hole extending in a ring shape along an inner wall of the memory cell hole in a cross-sectional view parallel to the substrate.

3. A resistance variable nonvolatile memory device comprising:
a substrate;
a first electrode formed on the substrate;
an interlayer insulating layer formed over the substrate and the first electrode;
a memory cell hole formed in the interlayer insulating layer on the first electrode;
a first resistance variable layer formed in at least a bottom portion of the memory cell hole and connected to the first electrode;
a second resistance variable layer formed inside the memory cell hole and located on the first resistance variable layer;
a second electrode formed inside the memory cell hole and located on the second resistance variable layer;
a semiconductor layer or an insulator layer which is formed over the interlayer insulating layer to cover the second electrode; and
a third electrode formed to cover at least the semiconductor layer or the insulator layer over the second electrode;
the first resistance variable layer and the second resistance variable layer respectively comprising metal oxides of the same kind;
the first resistance variable layer having a higher oxygen content than the second resistance variable layer;
the first resistance variable layer being formed in at least a portion of a side wall of the memory cell hole, in addition to the bottom portion of the memory cell hole; and
the first resistance variable layer formed on the side wall of the memory cell hole extending in a ring shape along an inner wall of the memory cell hole in a cross-sectional view parallel to the substrate.

4. The resistance variable nonvolatile memory device according to claim 1, wherein each of the first resistance variable layer and the second resistance variable layer comprises an oxide layer of tantalum or hafnium.

5. The resistance variable nonvolatile memory device according to claim 1, wherein the first electrode and the second electrode are respectively formed of materials comprising elements different from each other, and a standard electrode potential V1 of the first electrode, a standard electrode potential V2 of the second electrode and a standard electrode potential Vt of metal constituting the first and second resistance variable layers satisfy $Vt<V1$ and $V2<V1$.

6. The resistance variable nonvolatile memory device according to claim 5, wherein the first electrode comprises one of Pt, Ir, Pd, and Cu, or a combination and alloy of Pt, Ir, Pd, and Cu, and the second electrode comprises one of TaN, TiN, and W.

7. The resistance variable nonvolatile memory device according to claim 3, wherein the semiconductor layer comprises nitrogen-deficient silicon nitride.

8. The resistance variable nonvolatile memory device according to claim 3, comprising:
 a plurality of first electrodes formed in a stripe shape to extend in parallel with each other; and
 a plurality of third electrodes formed in a stripe shape to extend in parallel with each other;
 wherein each of the first electrodes crosses a corresponding one of the third electrodes on the memory cell hole.

9. The resistance variable nonvolatile memory device according to claim 1, wherein each of the first resistance variable layer and the second resistance variable layer comprises an oxygen-deficient transition metal oxide.

10. A method of manufacturing a resistance variable nonvolatile memory device comprising:
 a step of forming a first electrode on a substrate;
 a step of forming an interlayer insulating layer over the substrate and the first electrode;
 a step of forming a memory cell hole in the interlayer insulating layer in a predetermined location on the first electrode;
 a step of forming a first resistance variable layer into at least a bottom portion of the memory cell hole such that the first resistance variable layer is connected to the first electrode;
 a step of forming a second resistance variable layer on the first resistance variable layer inside the memory cell hole; and
 a step of forming a second electrode on the interlayer insulating layer such that the second electrode covers the second resistance variable layer;
 the first resistance variable layer and the second resistance variable layer respectively comprising metal oxides of the same kind;
 the first resistance variable layer having a higher oxygen content than the second resistance variable layer;
 the step of filling the first resistance variable layer includes forming the first resistance variable layer in at least a portion of a side wall of the memory cell hole, in addition to the bottom portion of the memory cell hole; and
 the first resistance variable layer formed on the side wall of the memory cell hole extending in a ring shape along an inner wall of the memory cell hole in a cross-sectional view parallel to the substrate.

11. A method of manufacturing a resistance variable nonvolatile memory device comprising:
 a step of forming a first electrode on a substrate;
 a step of forming an interlayer insulating layer over the substrate and the first electrode;
 a step of forming a memory cell hole in the interlayer insulating layer in a predetermined location on the first electrode;
 a step of forming a first resistance variable layer into at least a bottom portion of the memory cell hole such that the first resistance variable layer is connected to the first electrode;
 a step of forming a second resistance variable layer on the first resistance variable layer inside the memory cell hole;
 a step of forming a second electrode on the second resistance variable layer inside the memory cell hole; and
 a step of forming a third electrode on the interlayer insulating layer such that the third electrode covers the second electrode;
 the first resistance variable layer and the second resistance variable layer respectively comprising metal oxides of the same kind;
 the first resistance variable layer having a higher oxygen content than the second resistance variable layer;
 the step of filling the first resistance variable layer includes forming the first resistance variable layer in at least a portion of a side wall of the memory cell hole, in addition to the bottom portion of the memory cell hole; and
 the first resistance variable layer formed on the side wall of the memory cell hole extending in a ring shape along an inner wall of the memory cell hole in a cross-sectional view parallel to the substrate.

12. A method of manufacturing a resistance variable nonvolatile memory device comprising:
 a step of forming a first electrode on a substrate;
 a step of forming an interlayer insulating layer over the substrate and the first electrode;
 a step of forming a memory cell hole in the interlayer insulating layer in a predetermined location on the first electrode;
 a step of forming a first resistance variable layer into at least a bottom portion of the memory cell hole such that the first resistance variable layer is connected to the first electrode;
 a step of forming a second resistance variable layer on the first resistance variable layer inside the memory cell hole;
 a step of forming a second electrode on the second resistance variable layer inside the memory cell hole;
 a step of forming a semiconductor layer or an insulator layer over the interlayer insulating layer such that the semiconductor layer or the insulator layer covers the second electrode; and
 a step of forming a third electrode such that the third electrode covers at least the semiconductor layer or the insulator layer on the second electrode;
 the first resistance variable layer and the second resistance variable layer respectively comprising metal oxides of the same kind;
 the first resistance variable layer having a higher oxygen content than the second resistance variable layer;
 the step of filling the first resistance variable layer includes forming the first resistance variable layer in at least a portion of a side wall of the memory cell hole, in addition to the bottom portion of the memory cell hole; and
 the first resistance variable layer formed on the side wall of the memory cell hole extending in a ring shape along an inner wall of the memory cell hole in a cross-sectional view parallel to the substrate.

13. The method of manufacturing the resistance variable nonvolatile memory device according to claim 10, wherein each of the first resistance variable layer and the second resistance variable layer comprises an oxygen-deficient transition metal oxide.

14. The resistance variable nonvolatile memory device according to claim 2, wherein each of the first resistance variable layer and the second resistance variable layer comprises an oxide layer of tantalum or hafnium.

15. The resistance variable nonvolatile memory device according to claim 3, wherein each of the first resistance variable layer and the second resistance variable layer comprises an oxide layer of tantalum or hafnium.

16. The resistance variable nonvolatile memory device according to claim 2, wherein the first electrode and the second electrode are respectively formed of materials comprising elements different from each other, and a standard electrode potential V1 of the first electrode, a standard electrode potential V2 of the second electrode and a standard electrode potential Vt of metal constituting the first and second resistance variable layers satisfy Vt<V1 and V2<V1.

17. The resistance variable nonvolatile memory device according to claim 3, wherein the first electrode and the second electrode are respectively formed of materials comprising elements different from each other, and a standard electrode potential V1 of the first electrode, a standard electrode potential V2 of the second electrode and a standard electrode potential Vt of metal constituting the first and second resistance variable layers satisfy Vt<V1 and V2<V1.

18. The resistance variable nonvolatile memory device according to claim 2, wherein each of the first resistance variable layer and the second resistance variable layer comprises an oxygen-deficient transition metal oxide.

19. The resistance variable nonvolatile memory device according to claim 3, wherein each of the first resistance variable layer and the second resistance variable layer comprises an oxygen-deficient transition metal oxide.

20. The method of manufacturing the resistance variable nonvolatile memory device according to claim 11, wherein each of the first resistance variable layer and the second resistance variable layer comprises an oxygen-deficient transition metal oxide.

21. The method of manufacturing the resistance variable nonvolatile memory device according to claim 12, wherein each of the first resistance variable layer and the second resistance variable layer comprises an oxygen-deficient transition metal oxide.

* * * * *